(12) United States Patent
Matsuzaki

(10) Patent No.: US 6,769,044 B2
(45) Date of Patent: Jul. 27, 2004

(54) INPUT/OUTPUT INTERFACE AND SEMICONDUCTOR INTEGRATED CIRCUIT HAVING INPUT/OUTPUT INTERFACE

(75) Inventor: Yasurou Matsuzaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/003,048

(22) Filed: Dec. 6, 2001

(65) Prior Publication Data

US 2003/0016056 A1 Jan. 23, 2003

(30) Foreign Application Priority Data

Jul. 19, 2001 (JP) ........................................ 2001-219519

(51) Int. Cl.$^7$ ............................................. G06F 13/14
(52) U.S. Cl. ..................... 710/128; 375/371; 370/458
(58) Field of Search ..................... 326/86, 90; 375/371, 375/375, 373, 376; 370/508, 517

(56) References Cited

U.S. PATENT DOCUMENTS

| | | | | |
|---|---|---|---|---|
| 5,160,929 A | * | 11/1992 | Costello | ...................... 341/57 |
| 5,712,884 A | * | 1/1998 | Jeong | ......................... 375/375 |
| 6,031,847 A | * | 2/2000 | Collins et al. | ............... 370/508 |
| 6,304,106 B1 | * | 10/2001 | Cecchi et al. | .................. 326/86 |
| 6,446,152 B1 | * | 9/2002 | Song et al. | .................. 375/371 |

OTHER PUBLICATIONS

Patent Abstract of Japan, Publication No. 05–227035; Publication Date Sep. 3, 1993.
Patent Abstract of Japan, Publication No. 10–107684; Publication Date Apr. 24, 1998.

* cited by examiner

*Primary Examiner*—Vibol Tan
(74) *Attorney, Agent, or Firm*—Arent Fox PLLC

(57) ABSTRACT

A logical value is expressed by an order that transition edges appear in a plurality of transmission signals transmitting respectively on a plurality of signal lines. Otherwise, the logical value is expressed by a time difference between the transition edge of the transmission signal transmitting on the signal line and a transition edge of a standard timing signal. Therefore, a large amount of data can be transmitted through one signal line. Since a large amount of data can be transmitted by one transmission, it is possible to substantially increase the data transfer rate. Since only a small number of the signal lines are necessary, it is possible to reduce the number of input circuits and output circuits of the transmission signals, to reduce power consumption, and to reduce the wiring area of the signal lines.

36 Claims, 21 Drawing Sheets

Fig. 4

| No. | order of edges | for leading edge — logic L1 | | | for leading edge — logic L2 | | | | for trailing edge — logic L1 | | | | for trailing edge — logic L2 |
|---|---|---|---|---|---|---|---|---|---|---|---|---|---|
| | | D8,7 | D6,5 | D4 | D8,7 | D6,5 | D4 | D3 | D8,7 | D3 | D2,1 | D0 | |
| 0 | ABCD | 00 | 00 | 0 | 11 | 00 | 0 | 0 | 11bar | 0 | 00 | 0 | 00 / 0 |
| 1 | ABDC | 00 | 00 | 1 | 11 | 00 | 1 | 0 | 11bar | 0 | 00 | 1 | 00 / 1 |
| 2 | ACBD | 00 | 01 | 0 | 11 | 01 | 0 | 0 | 11bar | 0 | 01 | 0 | 01 / 0 |
| 3 | ACDB | 00 | 01 | 1 | 11 | 01 | 1 | 0 | 11bar | 0 | 01 | 1 | 01 / 1 |
| 4 | ADBC | 00 | 10 | 0 | 11 | 10 | 0 | 0 | 11bar | 0 | 10 | 0 | 10 / 0 |
| 5 | ADCB | 00 | 10 | 1 | 11 | 10 | 1 | 0 | 11bar | 0 | 10 | 1 | 10 / 1 |
| 6 | BACD | 00 | 11 | 0 | 11 | 11 | 0 | 0 | 11bar | 0 | 11 | 0 | 11 / 0 |
| 7 | BADC | 00 | 11 | 1 | 11 | 11 | 1 | 0 | 11bar | 0 | 11 | 1 | 11 / 1 |
| 8 | BCAD | 01 | 00 | 0 | 11 | 00 | 0 | 1 | 11bar | 1 | 00 | 0 | |
| 9 | BCDA | 01 | 00 | 1 | 11 | 00 | 1 | 1 | 11bar | 1 | 00 | 1 | |
| 10 | BDAC | 01 | 01 | 0 | 11 | 01 | 0 | 1 | 11bar | 1 | 01 | 0 | |
| 11 | BDCA | 01 | 01 | 1 | 11 | 01 | 1 | 1 | 11bar | 1 | 01 | 1 | |
| 12 | CABD | 01 | 10 | 0 | 11 | 10 | 0 | 1 | 11bar | 1 | 10 | 0 | |
| 13 | CADB | 01 | 10 | 1 | 11 | 10 | 1 | 1 | 11bar | 1 | 10 | 1 | |
| 14 | CBAD | 01 | 11 | 0 | 11 | 11 | 0 | 1 | 11bar | 1 | 11 | 0 | |
| 15 | CBDA | 01 | 11 | 1 | 11 | 11 | 1 | 1 | 11bar | 1 | 11 | 1 | |
| 16 | CDAB | 10 | 00 | 0 | | | | | 11 | - | 00 | 0 | |
| 17 | CDBA | 10 | 00 | 1 | | | | | 11 | - | 00 | 1 | |
| 18 | DABC | 10 | 01 | 0 | | | | | 11 | - | 01 | 0 | |
| 19 | DACB | 10 | 01 | 1 | | | | | 11 | - | 01 | 1 | |
| 20 | DBAC | 10 | 10 | 0 | | | | | 11 | - | 10 | 0 | |
| 21 | DBCA | 10 | 10 | 1 | | | | | 11 | - | 10 | 1 | |
| 22 | DCAB | 10 | 11 | 0 | | | | | 11 | - | 11 | 0 | |
| 23 | DCBA | 10 | 11 | 1 | | | | | 11 | - | 11 | 1 | |

Fig. 10

| No. | order of edges | output OUT of comparator 32b 1,2,3,4,5,6 | for leading edge logic L1 D8,7 | D6,5 | D4 | logic L2 D8,7 | D6,5 | D4 | D3 | output OUT of comparator 30b 1,2,3,4,5,6 | for trailing edge D8,7 | D3 | D2,1 | D0 | logic L1 / logic L2 |
|---|---|---|---|---|---|---|---|---|---|---|---|---|---|---|---|
| 0 | ABCD | 111111 | 00 | 00 | 0 | 11 | 00 | 0 | 0 | 111111 | 11bar | 0 | 00 | 0 | logic L1 |
| 1 | ABDC | 111110 | 00 | 00 | 1 | 11 | 00 | 0 | 0 | 111110 | 11bar | 0 | 00 | 1 | |
| 2 | ACBD | 111011 | 00 | 01 | 0 | 11 | 01 | 1 | 0 | 111011 | 11bar | 0 | 01 | 0 | |
| 3 | ACDB | 111001 | 00 | 01 | 1 | 11 | 01 | 1 | 0 | 111001 | 11bar | 0 | 01 | 1 | |
| 4 | ADBC | 111100 | 00 | 10 | 0 | 11 | 10 | 0 | 0 | 111100 | 11bar | 0 | 10 | 0 | |
| 5 | ADCB | 111000 | 00 | 10 | 1 | 11 | 10 | 1 | 0 | 111000 | 11bar | 0 | 10 | 1 | |
| 6 | BACD | 011111 | 00 | 11 | 0 | 11 | 11 | 1 | 0 | 011111 | 11bar | 0 | 11 | 0 | |
| 7 | BADC | 011110 | 00 | 11 | 1 | 11 | 11 | 1 | 0 | 011110 | 11bar | 1 | 00 | 1 | |
| 8 | BCAD | 001111 | 01 | 00 | 0 | 11 | 00 | 0 | 1 | 001111 | 11bar | 1 | 00 | 0 | |
| 9 | BCDA | 000111 | 01 | 00 | 1 | 11 | 00 | 0 | 1 | 000111 | 11bar | 1 | 00 | 1 | |
| 10 | BDAC | 010110 | 01 | 01 | 0 | 11 | 01 | 1 | 1 | 010110 | 11bar | 1 | 01 | 0 | |
| 11 | BDCA | 000110 | 01 | 01 | 1 | 11 | 01 | 1 | 1 | 000110 | 11bar | 1 | 01 | 1 | |
| 12 | CABD | 101011 | 01 | 10 | 0 | 11 | 10 | 0 | 1 | 101011 | 11bar | 1 | 10 | 0 | |
| 13 | CADB | 101001 | 01 | 10 | 1 | 11 | 10 | 1 | 1 | 101001 | 11bar | 1 | 10 | 1 | |
| 14 | CBAD | 001011 | 01 | 11 | 0 | 11 | 11 | 1 | 1 | 001011 | 11bar | 1 | 11 | 0 | |
| 15 | CBDA | 000011 | 01 | 11 | 1 | 11 | 11 | 1 | 1 | 000011 | 11bar | 1 | 11 | 1 | |
| 16 | CDAB | 100001 | 10 | 00 | 0 | | | | | 100001 | 11 | - | 00 | 0 | logic L2 |
| 17 | CDBA | 000001 | 10 | 00 | 1 | | | | | 000001 | 11 | - | 00 | 1 | |
| 18 | DABC | 110100 | 10 | 01 | 0 | | | | | 110100 | 11 | - | 01 | 0 | |
| 19 | DACB | 110000 | 10 | 01 | 1 | | | | | 110000 | 11 | - | 01 | 1 | |
| 20 | DBAC | 010100 | 10 | 10 | 0 | | | | | 010100 | 11 | - | 10 | 0 | |
| 21 | DBCA | 000100 | 10 | 10 | 1 | | | | | 000100 | 11 | - | 10 | 1 | |
| 22 | DCAB | 100000 | 10 | 11 | 0 | | | | | 100000 | 11 | - | 11 | 0 | |
| 23 | DCBA | 000000 | 10 | 11 | 1 | | | | | 000000 | 11 | - | 11 | 1 | |

INPUT/OUTPUT INTERFACE AND
SEMICONDUCTOR INTEGRATED CIRCUIT
HAVING INPUT/OUTPUT INTERFACE

BACKGROUND OF THE INVENTION

1. Field of the Invention

The present invention relates to an input/output interface for transmitting/receiving a transmission signal between semiconductor integrated circuits or inside the semiconductor integrated circuit.

2. Description of the Related Art

According to a conventional input/output interface, a transmission signal is transmitted/received by turning a signal line into a high level or a low level corresponding to a binary number. In this case, one-bit data is transmitted by one signal line.

According to the input/output interface like this, the number of the signal lines increases as the bit number of the transmission signal to be transmitted increases. Hence, there are the disadvantages that the chip size of the semiconductor integrated circuit increases or the area of a system board increases as the transmission amount increases. Further, input/output circuits for inputting/outputting data to/from the signal line are necessary for each bit. For this reason, when the number of the signal lines increases, the number of the input/output circuits increases, which causes the disadvantage that charging/discharging currents due to switching increase. Namely, a consumption current increases as a bit width of the data increases. Especially, the data amount handled by portable equipment such as a cellular phone which uses a battery as its power source has been increasing substantially. The increase of the data amount is an important issue because it has a significant influence on the operating time of the portable equipment like the above.

The technology of transmitting the data consisting of the plurality of bits through one signal line is disclosed in Japanese Unexamined Patent Application Publication No. Hei 5-227035 and Japanese Unexamined Patent Application Publication No. Hei 10-107684. In Japanese Unexamined Patent Application Publication No. Hei 5-227035, the logical value is expressed by the pulse width of the pulse signal and the combination of the timings that the transition edges appear. However, the four parameters T1 to T4 are necessary in order to express two-bit data, and hence the structures of the transmitting circuit and the receiving circuit are complicated. Further, since the timing margin is necessary for each of the parameters T1 to T4, the timing design of the transmitting circuit and the receiving circuit is difficult. For this reason, it is necessary to increase the cycle time of the pulse signal.

In Japanese Unexamined Patent Application Publication No. Hei 10-107684, the digital data is expressed by the time difference which is generated by the frame signals being adjacent timewise, in the spread spectrum communication system. In general, this kind of communication system has the complex transmitting/receiving circuits and its power consumption is large.

SUMMARY OF THE INVENTION

It is an object of the present invention to provide an input/output interface and a semiconductor integrated circuit which can transmit a large amount of data by a small number of signal lines.

It is another object of the present invention to reduce the number of the signal lines without decreasing a data transfer rate so that the numbers of input circuits and output circuits are reduced and power consumption is reduced.

It is still other object of the present invention to reduce the number of the signal lines without decreasing the data transfer rate so that the wiring area of the signal lines is reduced.

According to one of the aspects of the input/output interface of the present invention, a logical value is expressed by an order that transition edges appear in a plurality of transmission signals transmitting respectively on a plurality of signal lines. For this reason, a large amount of data can be transmitted through the small number of the signal lines according to the combination of the timings that the transition edges appear in the transmission signals. Since a large amount of data can be transmitted by one transmission, it is possible to substantially increase the data transfer rate.

Since only a small number of the signal lines are necessary, it is possible to reduce the number of the output circuits (output buffers) and the number of the input circuits (input buffers) of the transmission signals. Since the number of the circuits to be operated decreases, power consumption can be reduced on both the transmitting side and the receiving side of the transmission signals. Further, since only a small number of signal lines are necessary, it is possible to reduce the wiring area of the signal lines.

The logic can be expressed by a difference in timings that the transition edges appear (relative value), and hence a standard signal is not necessary. In other words, it is not necessary to synchronize the standard signal between the transmitting side and the receiving side of the transmission signal. Thus, the structures of a transmitting circuit and a receiving circuit of the transmission signal can be simplified.

Moreover, the transmitting circuit for transmitting the transmission signal and the receiving circuit for receiving the transmission signal are formed on separate semiconductor chips, whereby the number of the signal lines to be wired between the semiconductor chips can be reduced. For example, when the semiconductor chips are mounted on a printed-wiring board, the area of the signal lines on the printed-wiring board can be reduced. As a result of this, the size of the printed-wiring board is reduced, which makes it possible to reduce the size of a system and reduce the cost of the system.

The transmitting circuit for transmitting the transmission signal and the receiving circuit for receiving the transmission signal are formed on the same semiconductor chip, whereby the wiring area inside the semiconductor chip can be reduced. As a result of this, the chip size of the semiconductor chip can be reduced and the chip cost can be reduced.

According to another aspect of the input/output interface of the present invention, each of the transmission signals include a plurality of the transition edges, and the logical value is expressed by combining the order that the respective transition edges appear in the transmission signals. Hence, a larger amount of data can be transmitted.

According to another aspect of the input/output interface of the present invention, a logical value is expressed by using the order that the transition edges appear in pulse signals. In this case, only leading edges or trailing edges of the pulse signals, or both of the leading edges and the trailing edges of the pulse signals may be used. When both of the leading edges and the trailing edges of the pulse signals are used, 576 patterns of logic can be expressed by using four signal lines. This exceeds nine-bit binary data (512 patterns).

Since the signal lines are structured by three lines or more, the data can be transmitted more efficiently than in the case of transmitting the binary data as it is. Especially, when the present invention is applied to transmission signals with larger bit numbers in general, such as data or addresses, it is possible to reduce the number of bus lines substantially, so that power consumption can be substantially reduced and the size of the device can be reduced.

According to one of the aspects of the semiconductor integrated circuit of the present invention, a transmitting circuit includes, for example, a delay circuit which includes a plurality of delay stages connected in cascade, a selecting circuit and an edge generator. In the delay circuit, the standard signal is received on an initial stage of the delay stages and the standard signal is delayed and outputted as a timing signal from each delay stage. The selecting circuit selects any one of the timing signals for each signal line, according to a logical value. The edge generator generates a transition edge for each transmission signal, in synchronization with each of the selected timing signals. A large amount of data can be transmitted by structuring simple logic circuits like the above.

When the logic is expressed by combining both the leading edges and the trailing edges of the pulse signals, it is suitable to form the delay circuit for outputting the timing signals respectively for the leading edges and the trailing edges, and a first and a second selecting circuits for the leading edges and the trailing edges. For example, an output resistor of an open drain type is formed in the edge generator, whereby a plurality of the transmitting circuits can be connected to the bus line. By forming a decoder for decoding the logical value in the transmitting circuit, the selecting circuit can easily select one of the timing signals according to the result of the decoding by the decoder.

According to another aspect of the semiconductor integrated circuit of the present invention, the receiving circuit includes a comparing circuit including a plurality of comparators and a logical value generating circuit including a decoder. The comparing circuit compares the order that the transition edges appear in the transmission signals. Each comparator is structured by a flip-flop or the like which receives the two different transmission signals. The logical value generating circuit decodes the result of the comparison by the comparing circuit, and generates the logical value based on the result of the decoding. In this case, the receiving circuit may restore the original logical value which is transferred from the transmitting circuit, or it may generate a logical value (for example, inverting logic) which is different from the logical value transferred from the transmitting circuit. Thus, a large amount of data can be transmitted by structuring simple logic circuits like the above.

According to another aspect of the input/output interface of the present invention, a logical value is expressed by a time difference between a transition edge of a transmission signal transmitting on a signal line and the transition edge of a standard timing signal. For this reason, the logical values consisting of a plurality of bits can be transferred by one signal line. Namely, a large amount of data can be transmitted by a small number of the signal lines. Since a large amount of data can be transmitted by one transmission, it is possible to substantially increase the data transfer rate. Therefore, it is possible to reduce the number of the signal lines as compared with the conventional art. Since only a small number of the signal lines are necessary, it is possible to reduce the number of the output circuits (output buffers) and the input circuits (input buffers) of the transmission signals. Since the number of the circuits to be operated decreases, power consumption can be reduced on both the transmitting side and the receiving side of the transmission signals. Further, since only a small number of the signal lines are necessary, it is possible to reduce the wiring area of the signal lines.

According to another aspect of the input/output interface and another aspect of the semiconductor integrated circuit of the present invention, the transmitting circuit converts the respective logical values, expressed with a plurality of bits, to predetermined delay time. Each logical value is outputted as the transmission signal, which is behind the standard timing signal by the delay time, where the output is made to the signal line. The receiving circuit detects the time that the transition edge of the transmission signal transmitting through the signal line is delayed, compared to the transition edge of the standard timing signal, and generates the logical value according to the delay time. The transmitting circuit needs to delay the transmission signal by the delay time corresponding to the logical value. The receiving circuit can generate a logical value only by detecting the time that the transmission signal is delayed, compared to the transition edge of the standard timing signal. Therefore, the logical value can be converted to the transmission signal by the simple transmitting circuit and the transmission signal can be converted to a logical value by the simple receiving circuit. The receiving circuit may restore the original logical value which is transferred from the transmitting circuit, or it may generate the logical value (for example, inverting logic) which is different from the logical value transferred from the transmitting circuit. Especially, when the present invention is applied to transmission signals with larger bit numbers in general, such as data or addresses, it is possible to reduce the number of the bus lines substantially, so that the power consumption can be substantially reduced and the size of the device can be reduced.

For example, a variable delay circuit may be formed in the transmitting circuit and a delay time of the variable delay circuit may be changed according to the logical value, thereby generating the transmission signal to be transmitted. Further, the delay circuit for generating the plurality of the timing signals whose phases are different from that of the standard timing signal, and a comparing circuit for comparing the phase of the received transmission signal and the phase of each timing signal and for detecting the delay time of the transmission signal to the standard timing signal may be formed in the receiving circuit, thereby generating the logical value with ease. In this case, a plurality of latch circuits for latching logic levels of the transmission signals by each timing signal are formed in the comparing circuit so that the phase of the transmission signal can be expressed by logic levels to be latched in each latch circuit. Further, a simple encoder is formed in the comparing circuit so that the logical value can be generated based on the logic levels being latched in the latch circuits.

The transmitting circuit and the receiving circuit are formed on separate semiconductor chips, whereby the number of signal lines to be wired between the semiconductor chips can be reduced. For example, when the semiconductor chips are mounted on the printed-wiring board, the area of the signal lines on the printed-wiring board can be reduced. As a result of this, the size of the printed-wiring board is reduced, which makes it possible to reduce the size of the system and reduce the cost of the system.

The transmitting circuit and the receiving circuit are formed on the same semiconductor chip so that the wiring area inside the semiconductor chip can be reduced. As a result of this, the chip size of the semiconductor chip can be reduced, and the chip cost can be reduced.

According to another aspect of the input/output interface of the present invention, since the transmitting circuit and the receiving circuit are respectively formed on a plurality of semiconductor chips, the data can be transmitted/received by a small number of signal lines. In this case, a first input circuit and a second input circuit for receiving a transmission signal and a standard timing signal which is outputted from another semiconductor chip, respectively, are formed for receiving the transmission signal, and a first output circuit for outputting another transmission signal, a signal generating circuit for generating another standard timing signal according to an external clock signal and a second output circuit for outputting the standard timing signal to the exterior of the chip are formed for transmitting the transmission signal, in each semiconductor chip.

In this case, an input of the first input circuit and an output of the first output circuit are connected to a common external terminal and the signal line is allowed to transmit the transmission signal bidirectionally, so that the number of the signal lines can be further reduced. Similarly, an input of the second input circuit and an output of the second output circuit are connected to a common external terminal and the signal line is allowed to transmit the transmission signal bidirectionally, so that the number of the signal lines can be further reduced.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 4 is a conversion table for converting a logic value to a signal which is output to the data bus line;

FIG. 10 is a conversion table for restoring a signal, which is output into the data bus line, to a original logic value;

DESCRIPTION OF THE PREFERRED EMBODIMENTS

Hereinafter, preferred embodiments of the present invention will be explained with reference to the drawings.

Figure 1:
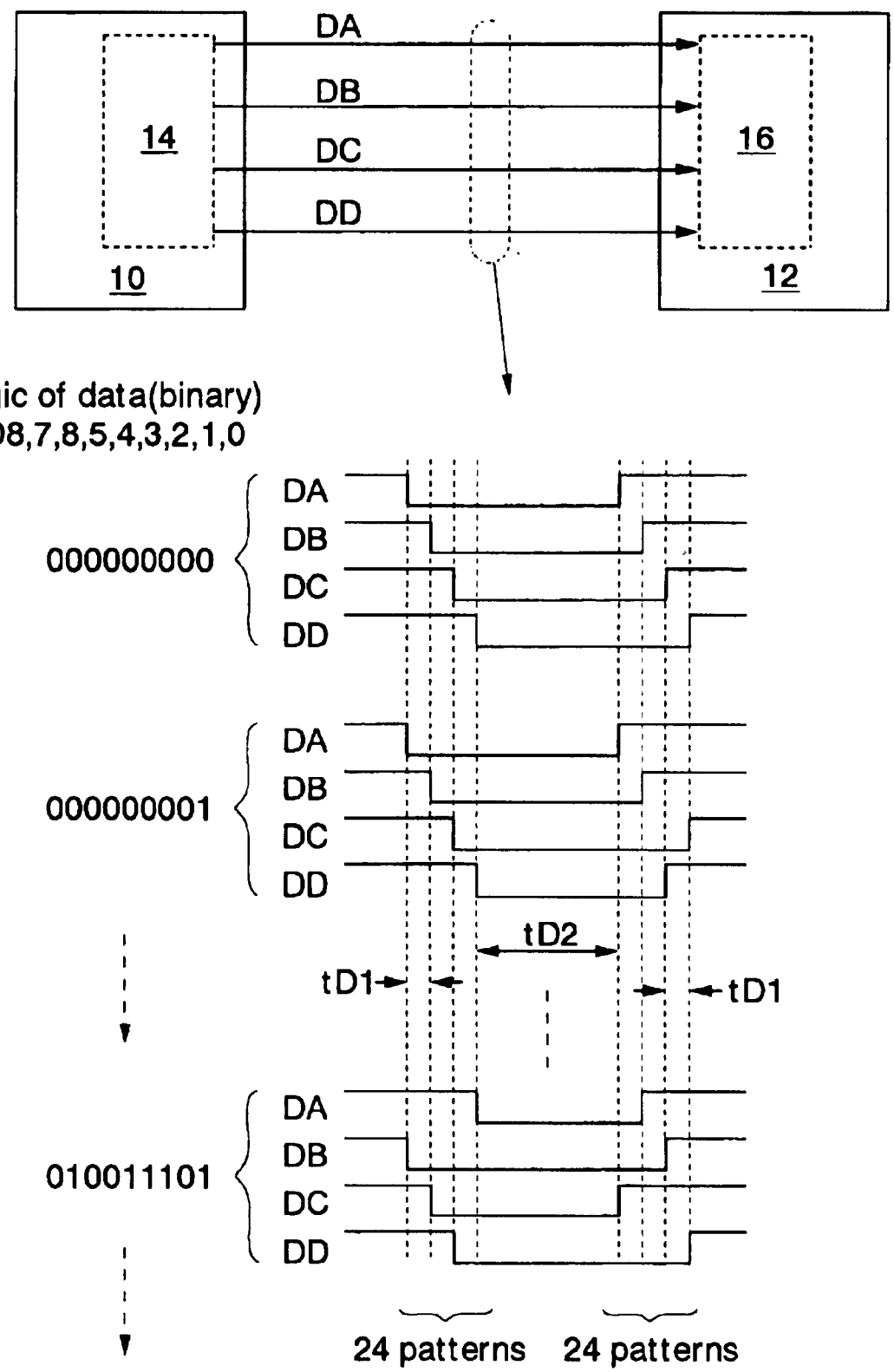
FIG. 1 is an explanatory view showing the first basic principle in the present invention.

FIG. 1 shows the first basic principle in the present invention. Here, an example of transmitting data from a transmitting device 10 to a receiving device 12 by using four data bus lines (signal lines) DA, DB, DC, and DD will be explained.

A data transmitting circuit 14 in the transmitting device 10 outputs low level pulses (hereinafter referred to as the L-pulses) to the data bus lines DA, DB, DC, and DD. Logical values of the data are expressed by an order that transition edges appear in the L-pulses. Namely, combinations of leading edges (down edges) of the L-pulses express 24 patterns of logic, and additionally, combinations of trailing edges (up edges) of the L-pulses express 24 patterns of the logic. By combining the leading edges and the trailing edges, 576 patterns of the logic can be expressed. This exceeds nine-bit binary data (512 patterns). In other words, in this invention, the data whose amount is larger than nine bits can be transmitted only by using the four data bus lines DA, DB, DC, and DD.

A minimum interval between the leading edges of the transmission signals to be outputted to the data bus lines DA to DD and a minimum interval between the trailing edges thereof are set as tD1, and an interval between the leading edge and the trailing edge which are nearest to each other is set as tD2. Thus, the leading edges and the trailing edges of the transmission signals which are outputted to the data bus lines DA to DD do not overlap with themselves, and the nearest leading edges and the nearest trailing edges respectively have the intervals tD1 therebetween. The interval tD1 is set as the value by which the order of the transition edges can be judged, and the interval tD2 is set as the value by which the leading edge and the trailing edge can be identified even in the transmission signal with the smallest pulse width. In concrete, the intervals tD1 and tD2 are set according to the characteristics of the transmitting circuit 14, a receiving circuit 16 and transmission lines (the data bus lines DA to DD in this example).

Meanwhile, the data receiving circuit 16 in the receiving device 12 judges the orders that the leading edges and the trailing edges appear in the transmission signals which are transmitted through the data bus lines DA, DB, DC, and DD, and generates the logical values. It should be mentioned that the receiving circuit 16 may restore the logical values (original logical values) which are used in the transmitting device 10, or it may generate logical values (for example, inverting data of the original logical values) which are specially used in the receiving device 12.

Since the logic is expressed by the relative order of the transition edges of the transmission signals, it is not necessary to synchronize the transmission signals transmitting between the transmitting device 10 and the receiving device 12, by using a standard signal or the like. For this reason, timing design of the data transmitting circuit 14 in the transmitting device 10 and the data receiving circuit 16 in the receiving device 12 is facilitated. A problem of skew of the transmission signals to be transmitted on the data bus lines can be easily solved by equating wiring lengths of the data bus lines. As a result of this, a large amount of data can be transmitted without fail between the simple transmitting circuit 14 and the receiving circuit 16.

It should be noted that, when the logic is expressed by the order of the leading edges and the trailing edges of pulse signals, 14400 patterns ($(5\times4\times3\times2)^2$) of the logic can be expressed by using five data bus lines. This exceeds 13-bit binary data (8192 patterns).

FIG. 2 to FIG. 12 show a first embodiment of an input/output interface and a semiconductor integrated circuit according to the present invention. Signal lines shown by bold lines in the drawings mean that each of these is structured by a plurality of the lines.

The input/output interface is structured by the data transmitting circuit 14 in the transmitting device 10, the data receiving circuit 16 in the receiving device 12, and the data bus lines DA, DB, DC, and DD for transferring the data from the transmitting device 10 to the receiving device 12, as shown in FIG. 1. For example, the transmitting device 10 is a microcomputer and the receiving device 12 is a semiconductor memory device such as DRAM. Namely, the transmitting device 10 and the receiving device 12 are mounted on a system board or the like as separate semiconductor chips. Signal lines for transmitting a control signal and an address signal which are not shown in FIG. 1 are wired between the transmitting device 10 and the receiving device 12.

Figure 2:
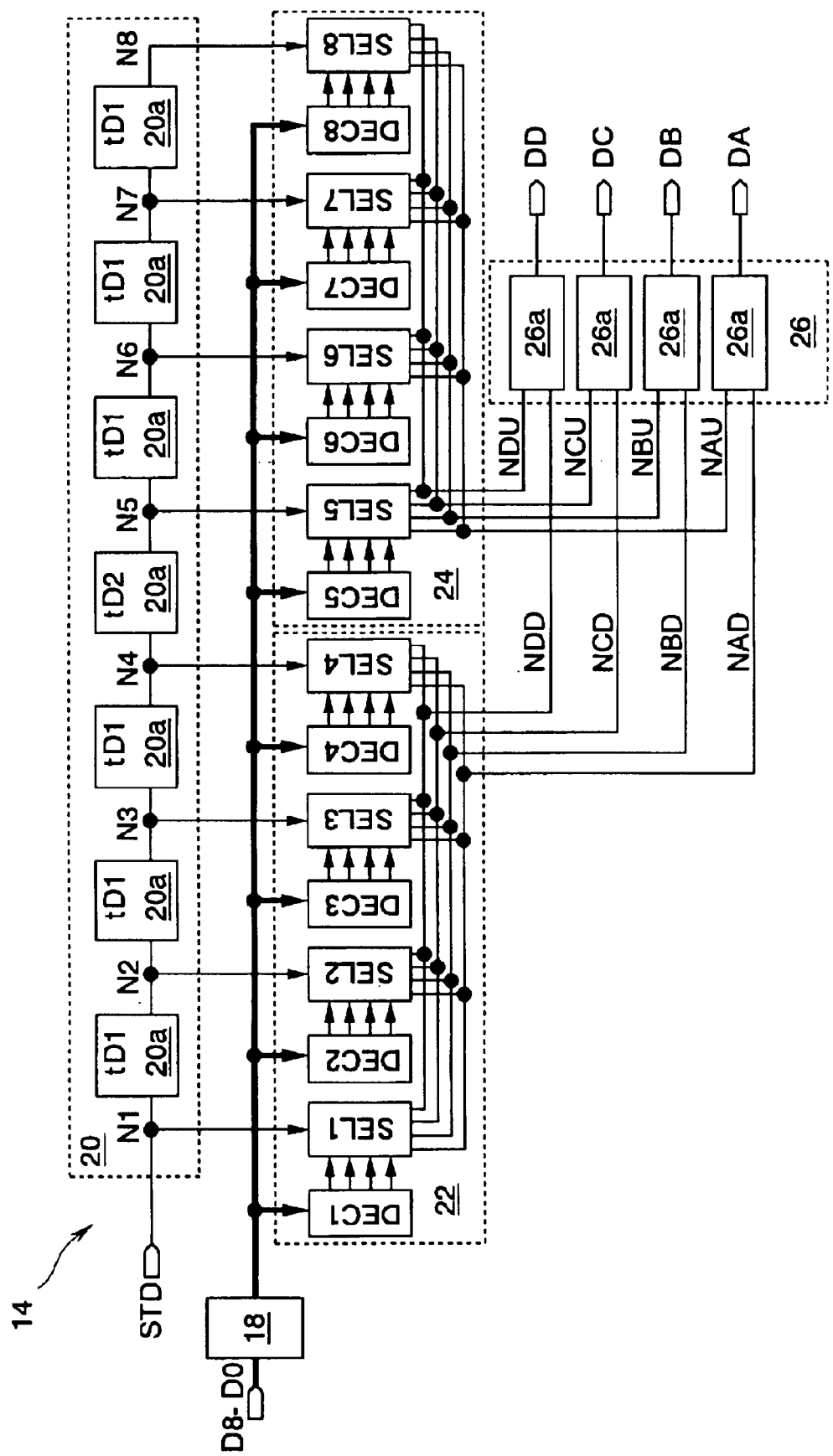
FIG. 2 is a block diagram showing the details of a transmitting circuit in the first embodiment of the present invention.

FIG. 2 shows the details of the transmitting circuit 14 in the transmitting device 10. The transmitting circuit 14 includes a predecoder 18, a delay circuit 20, selecting circuits 22, 24 and an edge generator 26.

The predecoder 18 decodes logical values D8 to D0 consisting of nine bits and outputs a decoding signal.

The delay circuit 20 includes seven delay stages 20a which are connected in cascade. An initial stage of the delay stages 20a on receives a standard signal STD. The standard signal STD is a high-level pulse signal. Each delay stage 20a delays the standard signal STD in sequence and outputs it as timing signals N2 to N8. Further, the delay circuit 20 outputs the standard signal STD as a timing signal N1. Namely, the delay circuit 20 operates as a timing signal generator for generating a plurality of the timing signals N1 to N8 whose transition edges are different from each other. Each of the numerals tD1 and tD2 shown in the respective delay stages 20a is the interval (delay time of the delay stage 20a) in FIG. 1.

The first selecting circuit 22 is the circuit for setting the timing of the leading edges of the L-pulse signals which are outputted from the transmitting circuit 14. The first selecting circuit 22 includes decoders DEC1 to DEC4 and selectors SEL1 to SEL4. The decoders DEC1 to DEC4 generate selecting signals for operating the selectors SEL1 to SEL4 by using the decoding signal. The logic of the decoders DEC1 to DEC4 are decided corresponding to a later-described conversion table. According to the selecting signal, the selectors SEL1 to SEL4 respectively output the timing signals N1 to N4 to any of nodes NDD, NCD, NBD, and NAD.

The second selecting circuit 24 is the circuit for setting the timing of the trailing edges of the L-pulse signals which are outputted from the transmitting circuit 14. The second selecting circuit 24 includes decoders DEC5 to DEC8 and selectors SEL5 to SEL8. The decoders DEC5 to DEC8 generate selecting signals for operating the selectors SEL5 to SEL8 by using the decoding signal. The logic of the decoders DEC5 to DEC8 are decided corresponding to the later-described conversion table. According to the selecting signal, the selectors SEL5 to SEL8 respectively output the timing signals N5 to N8 to any of the nodes NDD, NCD, NBD, and NAD. The nodes NDD, NCD, NBD, and NAD are the nodes which correspond to the data bus lines DD, DC, DB, and DA, respectively.

The edge generator 26 includes four edge generating units 26a which correspond to the nodes NDD, NCD, NBD, and NAD, respectively. The edge generating units 26a generate the leading edges of the L-pulse signals which are outputted to the data bus lines DD, DC, DB, and DA, in synchronization with the timing signals N1 to N4 which are transmitted to the nodes NDD, NCD, NBD, and NAD, respectively. Further, the edge generating units 26a generate the trailing edges of the L-pulse signals which are outputted to the data bus lines DD, DC, DB, and DA, in synchronization with the timing signals N5 to N8 which are transmitted to the nodes NDD, NCD, NBD, and NAD, respectively.

Figure 3:
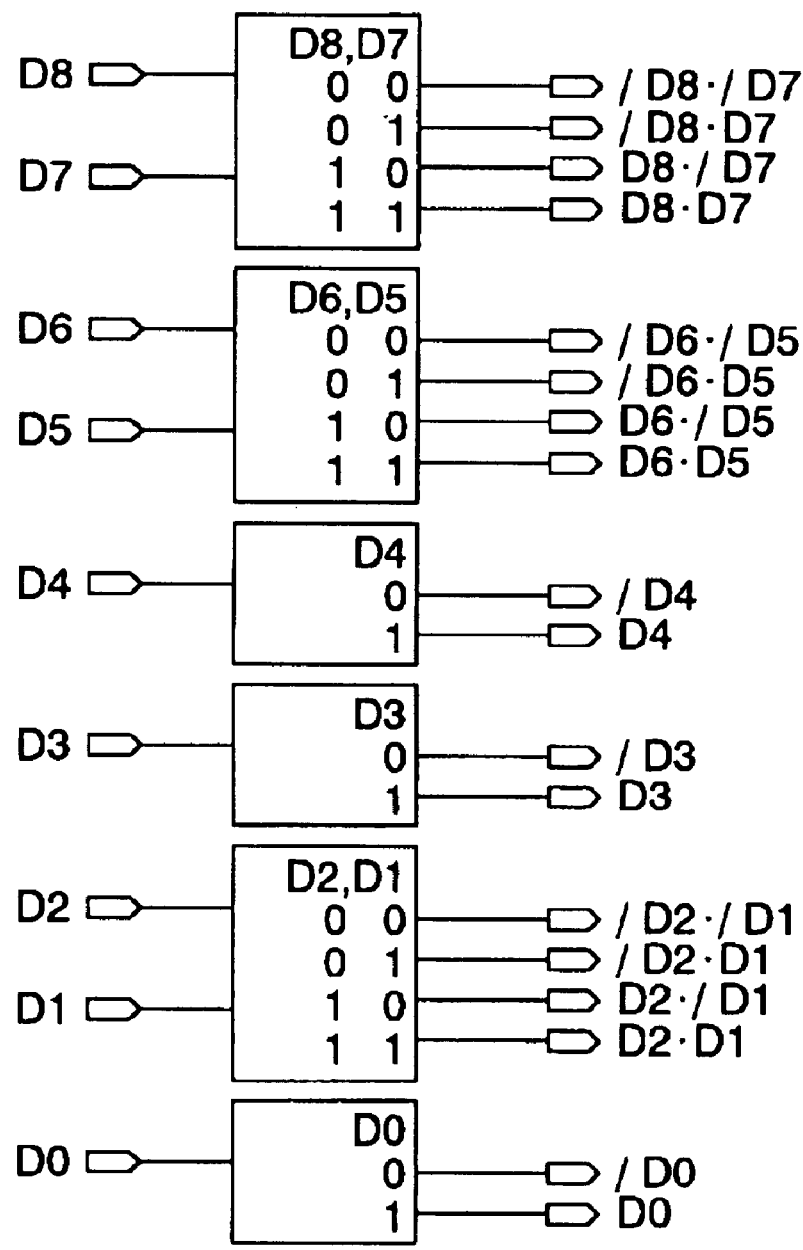
FIG. 3 is a block diagram showing the predecoder in FIG. 1.

FIG. 3 shows the details of the predecoder 18 in FIG. 2. The predecoder 18 includes a decoding circuit for generating four decoding signals according to the logical values D8 to D7 a decoding circuit for generating four decoding signals according to the logical values D6 to D5, a decoding circuit for generating two decoding signals according to the logical value D4, a decoding circuit for generating two decoding signals according to the logical value D3, a decoding circuit for generating four decoding signals according to the logical values D2 to D1, and a decoding circuit for generating two decoding signals according to the logical value D0 . The symbol "/" in the drawing shows a negative logic. When the logical values (D8 to D7, for example) are the logic shown in the frame in the drawing, each decoding circuit turns the corresponding decoding signal to the high level.

FIG. 4 is a conversion table for converting the logical values D8 to D0 of nine bits to the L-pulse signals which are outputted to the data bus lines DA to DD. "Order of edges" show the orders that the leading edges or the trailing edges appear in the L-pulse signals to be outputted to the data bus lines DA to DD. For example, "ABCD" in the number 0 means that the leading edges (or the trailing edges) of the L-pulse signals change in the order of the data bus lines DA, DB, DC, and DD, and "BADC" in the number 7 means that the leading edges (or the trailing edges) of the L-pulse signals change in the order of the data bus lines DB, DA, DD, and DC.

In this embodiment, the data is transferred by using the four data bus lines DA to DD, as explained with reference to FIG. 1. Hence, there are 24 possible combinations each for the leading edges and the trailing edges of the L-pulse signals, which are from the number 0 to the number 23. 576 patterns of the logical values can be expressed by the four L-pulse signals. However, it is impossible to express these values by the binary number. Since 512 patterns of the data (nine bits) are actually transmitted, logic L1 and logic L2 shown in the drawing are used to generate control signals for operating the selectors SEL1 to SEL8 in accordance with the logical values D8 to D0. "11 bar" in the drawing means that the logical values D8 to D7 are not "11".

The logic L1 is used when the logical values D8 to D0 are "000000000" to "101111111", and the logic L2 is used when the logical values D8 to D0 are "110000000" to "111111111". For example, the logical values D8 to D0 "001011000" are included in the logic L1. Hence, as shown by the bold solid lines in the drawing, the order of the leading edges becomes "ADCB" in the number 5, and the order of the trailing edges becomes "BCAD" in the number 8. Meanwhile, the logical values D8 to D0 "111010011" are included in the logic L2. As shown by the bold broken lines in the drawing, the order of the leading edges becomes "ADCB" in the number 5, and the order of the trailing edges becomes "DACB" in the number 19. Incidentally, the conversion table is not limited to the FIG. 4. Other conversion tables may be formed by changing the correspondence between the logical values D8 to D0 and the order of the edges.

Figure 5:
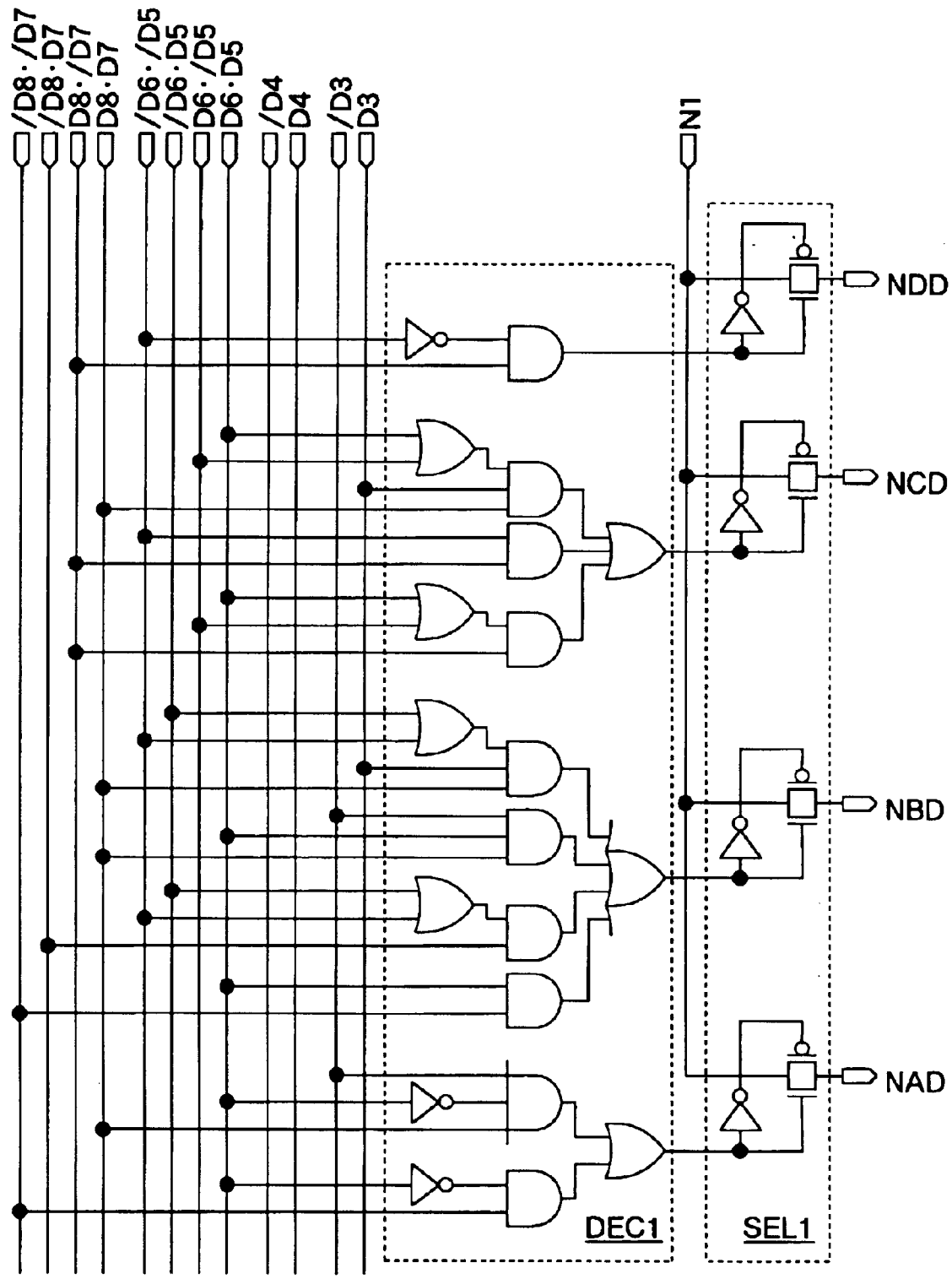
FIG. 5 is a circuit diagram showing the details of the decoder DEC1 and selector SEL1 in FIG. 2.

FIG. 5 shows the details of the decoder DEC1 and the selector SEL1 shown in FIG. 2. The decoder DEC1 turns any of its four outputs into the high level according to the logical values D8 to D0 to be transferred. The selector SEL1 turns on any of four CMOS transmission gates which respectively connect the signal line of the timing signal N1 and the nodes NAD to NDD, according to an output signal from the decoder DEC1. As a result of this, the timing signal N1 is outputted to any of the nodes NAD to NDD in accordance with the conversion table shown in FIG. 4. The decoder DEC1 shown in FIG. 5 is only one example for realizing the logic in the conversion table in FIG. 4 with a relatively small number of elements. There are many other circuits for realizing the same logic. Although not shown in the drawing, the decoders DEC2 to DEC4 and the selectors SEL2 to SEL4 are structured similarly to the decoder DEC1 and the selector SEL1.

Figure 6:
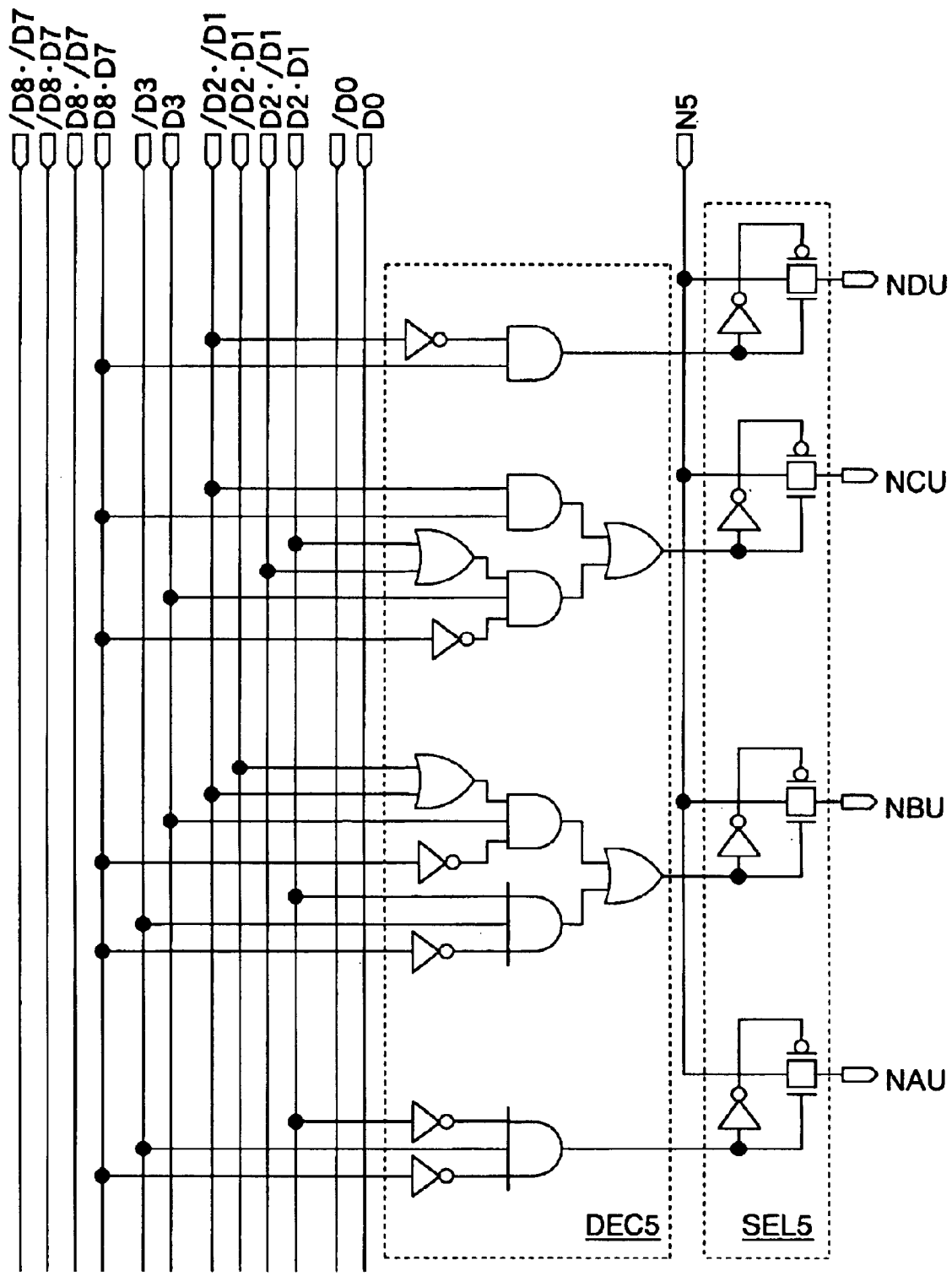
FIG. 6 is a circuit diagram showing the details of the decoder DEC5 and selector SEL5 in FIG. 2.

FIG. 6 shows the details of the decoder DEC5 and the selector SEL5 shown in FIG. 2. The decoder DEC5 turns any of its four outputs into the high level according to the logical values D8 to D0 to be transferred. The selector SEL5 turns on any of four CMOS transmission gates which respectively connect the signal line of the timing signal N5 and nodes NAU to NDU, according to an output signal from the decoder DEC5. As a result of this, the timing signal N5 is outputted to any of the nodes NAU to NDU in accordance with the conversion table shown in FIG. 4.

Figure 7:
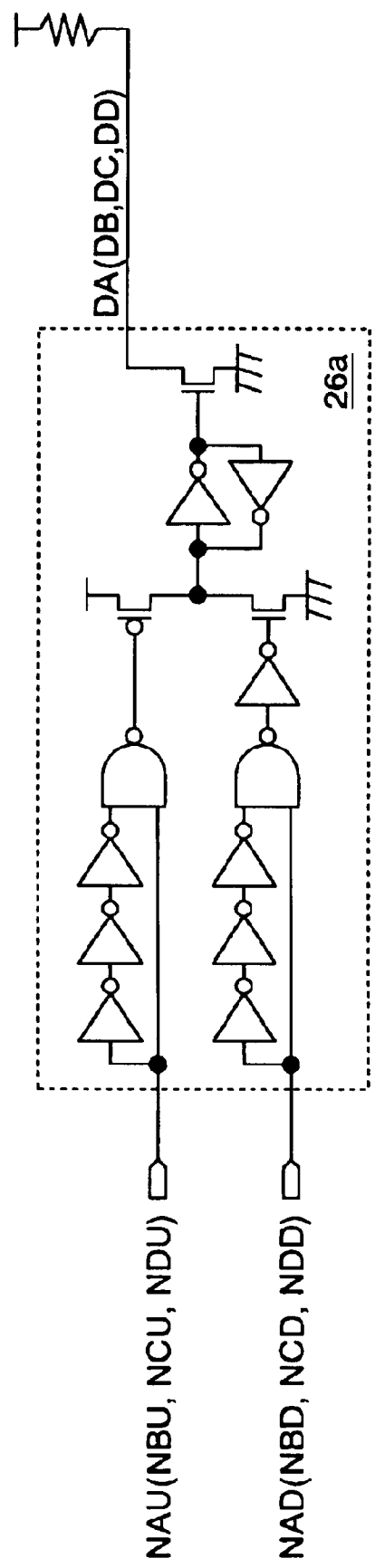
FIG. 7 is a circuit diagram showing the details of the edge generating unit in the edge generator in FIG. 2.

FIG. 7 shows the details of the edge generating unit 26a in the edge generator 26 shown in FIG. 2. The edge generating unit 26a includes an L-pulse generator for generating the L-pulse in synchronization with a rising edge of any of the timing signals N1 to N4 which is transmitted to the node NAD (or NBD, NCD, or NDD), an H-pulse generator for generating an H-pulse signal in synchronization with a rising edge of any of the timing signals N5 to N8 which is transmitted to the node NAU (or NBU, NCU, or NDU), a pMOS transistor (which is controlled by an output of the L-pulse generator) and an nMOS transistor (which is controlled by an output of the H-pulse generator) which are connected in series between a power source line and a ground line, a latch circuit for latching outputs of the pMOS transistor and the nMOS transistor, and an output transistor (output circuit) of an open drain type which is controlled by the outputs of the pMOS transistor and the nMOS transistor. An output of the output transistor is connected to the data bus line DA (or DB, DC, or DD) which is connected to the power source line through, for example, a terminating resistor of 50 Ω.

The data bus line DA (or DB, DC, or DD) is turned into a low level in synchronization with the rising edge of any of the timing signals N1 to N4, and turned into the high level in synchronization with the rising edge of any of the timing signals N5 to N8. That is, the L-pulse signals whose leading edges and trailing edges synchronize to the selected timing signals are outputted to the data bus lines DA to DD. As a result of this, 512 patterns of the logical values D8 to D0 can be transmitted only by using the four data bus lines DA to DD.

Figure 8:
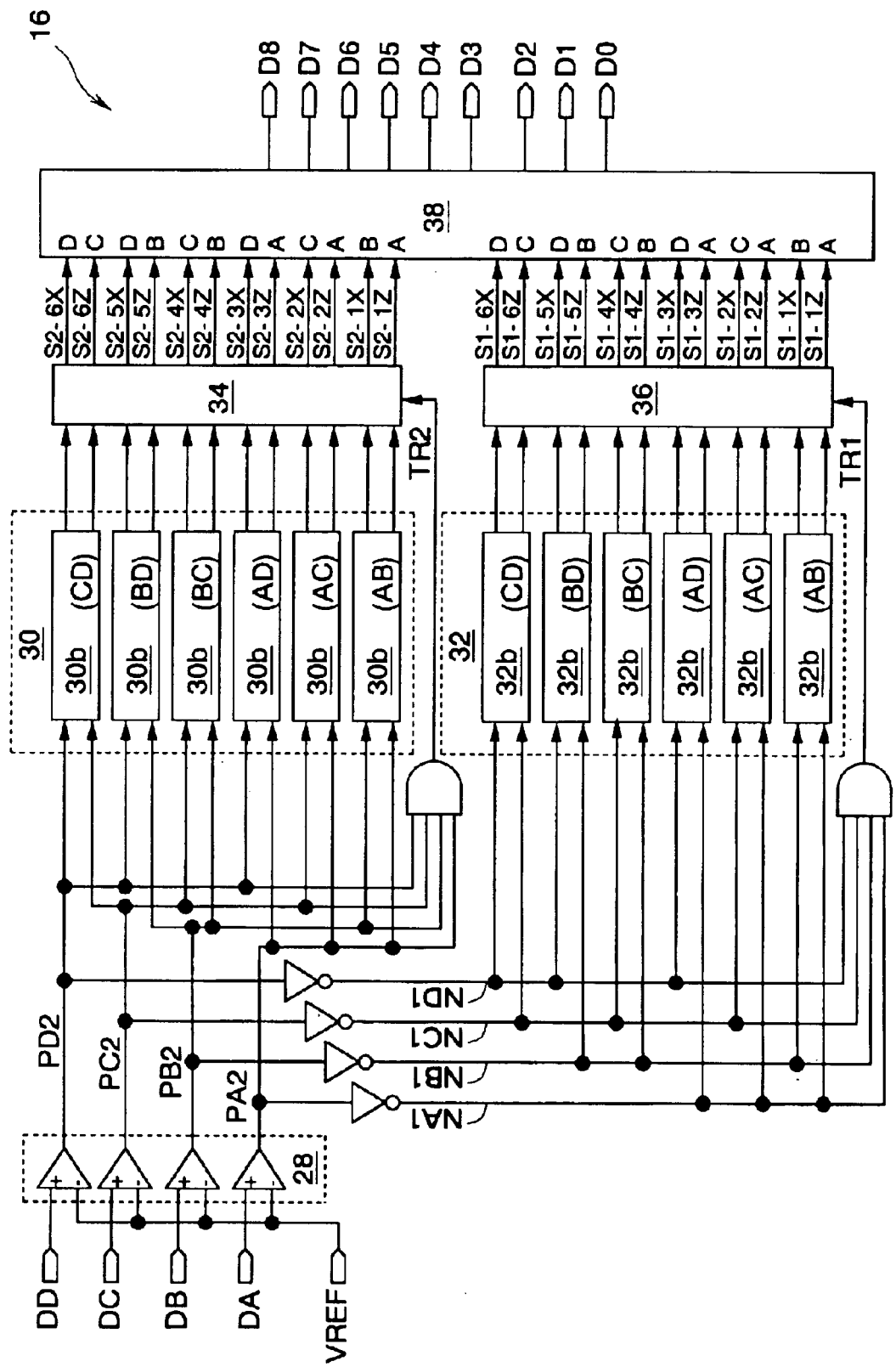
FIG. 8 is a block diagram showing the details of a receiving circuit in the first embodiment of the present invention.

FIG. 8 shows the details of the receiving circuit 16 in the receiving device 12. The receiving circuit 16 includes an input circuit 28, comparing circuits 30 and 32, transmitting circuits 34, 36 and a decoder 38.

The input circuit 28 includes four input buffers for receiving the L-pulse signals which are transmitted through the data bus lines DA to DD. Each of the input buffers is structured by a differential amplifier, one of whose inputs receives the L-pulse signal and the other thereof receives a reference voltage VREF. The input buffers respectively output the received signals as positive signals PA2, PB2, PC2, and PD2 having positive logic. The positive signals PA2, PB2, PC2, and PD2 are inverted by inverters and outputted as negative signals NA2, NB2, NC2, and ND2 having negative logic.

The comparing circuit 30 includes six comparators 30b (second comparators) for comparing the orders that the trailing edges (up edges) appear in the two L-pulse signals. "(CD)" or the like shown in each comparator 30b shows the alphabet of the data bus line to which the L-pulse signal compared by the comparator 30b is transmitted. Each of the comparators 30b outputs the result of the comparison as complementary signals.

The comparing circuit 32 includes six comparators 32b (first comparators) for comparing the order that the leading edges (down edges) appear in the two L-pulse signals. "(CD)" or the like shown in each comparator 32b shows the alphabet of the data bus line to which the L-pulse signal compared by the comparator 32b is transmitted. Each of the comparators 32b outputs the result of the comparison as complementary signals.

The transmitting circuit 34 transfers the complementary signals which are outputted from the comparators 30b to the decoder 38 in synchronization with a transmitting signal TR2. The transmitting signal TR2 is generated by AND logic of the positive signals PA2, PB2, PC2, and PD2. Namely, the transmitting signal TR2 is outputted in accordance with the trailing edge of the L-pulse signal with the latest timing, out of the four L-pulse signals.

The transmitting circuit 36 transfers the complementary signals which are outputted from the comparators 32b to the decoder 38 in synchronization with a transmitting signal TR1. The transmitting signal TR1 is generated by AND operation of the negative signals NA2, NB2, NC2, and ND2. Namely, the transmitting signal TR1 is outputted in accordance with the leading edge of the L-pulse signal with the latest timing, out of the four L-pulse signals.

For example, complementary transmitting signals S2 to 6X and S2 to 6Z which are outputted from the transmitting circuit 34 are respectively turned into the low level and the high level, when the corresponding comparator 30a judges that the timing that the trailing edge of the L-pulse signal appears on the data bus line DC is earlier than the timing that the trailing edge of the L-pulse signal appears on the data bus line DD. This applies to complementary transmitting signals which are outputted from the transmitting circuit 36 as well. Incidentally, each of the alphabets A, B, C, and D shown inside the frame of the decoder 38 means that the timing that the transitional edge of the L-pulse which corresponds to the alphabet appears is early when the transmitting signal from the transmitting circuits 34 and 36 shown by the alphabet is at a high level. It should be mentioned that the alphabets A, B, C, and D respectively correspond to the L-pulse signals transmitting through the data bus lines DA, DB, DC, and DD.

The decoder 38 restores the logic which is transmitted from the transmitting circuit 14 according to the results of the comparison (transmitting signals) outputted from the comparators 30b and 32b, and outputs it as the logical values D8 to D0.

Figure 9:
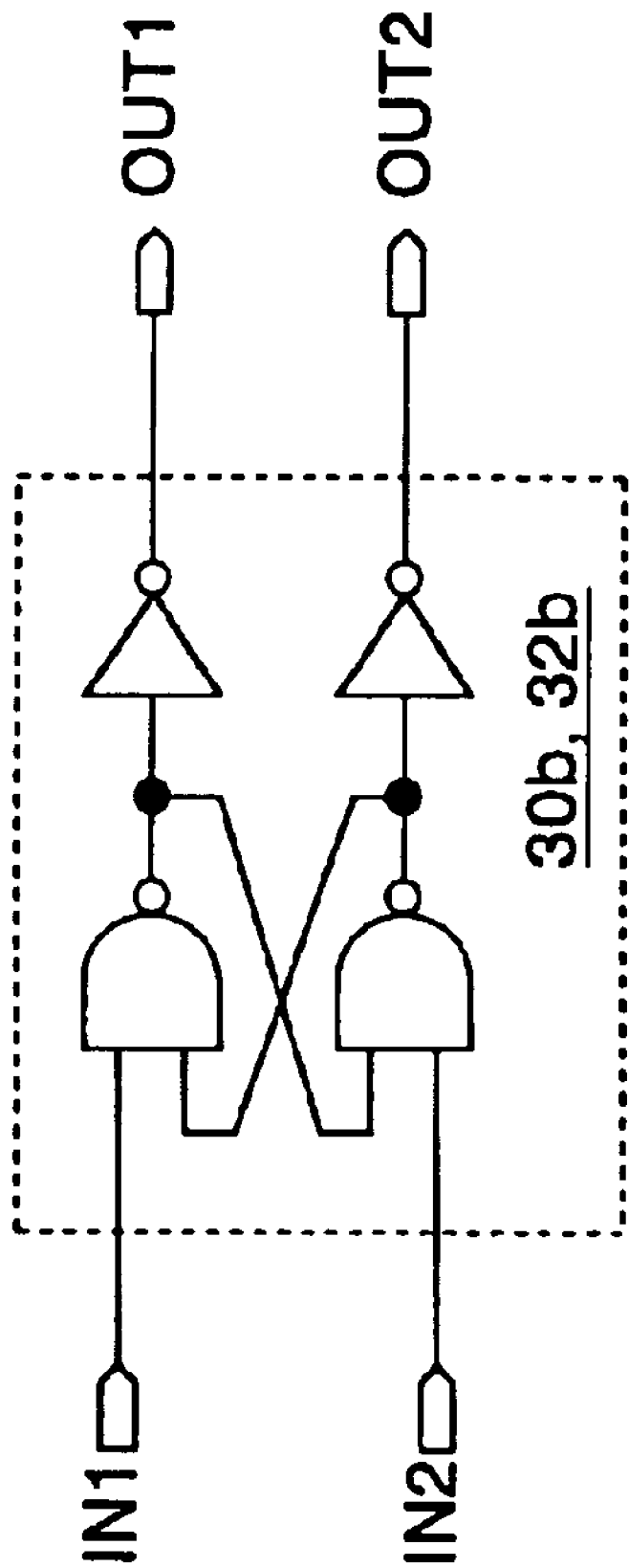
FIG. 9 is a circuit diagram showing the details of the comparator in FIG. 8.

FIG. 9 shows the details of the comparators 30b and 32b in FIG. 8. Each comparators 30b and 32b is structured by an RS flip-flop, in which inputs and outputs of NAND gates having two inputs are connected to each other. Outputs of the NAND gates are connected to output terminals through inverters. For example, when an input IN1 changes to the high level first, outputs OUT1 and OUT2 are turned into the high level and the low level, respectively, and when an input IN2 changes to the high level first, the outputs OUT1 and OUT2 are turned into the low level and the high level, respectively.

FIG. 10 is a conversion table for restoring the L-pulse signal which is received through the data bus lines DA to DD to the original logical values D8 to D0. "No.", "order of edges", "logic 1" and "logic 2" are the same as those of the conversion table shown in FIG. 4.

For example, when the "order of edges" of the leading edge and the trailing edge are "ADCB (No. 5)" and "BCAD (No. 8)", the outputs of the comparators 32b and 30b become "111000" and "001111", respectively. Here, the output of the comparator 32b "111000" shows the logic levels of the transmitting signals S1 to 1Z, S1 to 2Z, S1 to 3Z, S1 to 4Z, S1 to 5Z, and S1 to 6Z having the positive logic, as shown in FIG. 8. Similarly, the output of the comparator 30b "001111" shows the logic levels of the transmitting signals S2 to 1Z, S2 to 2Z, S2 to 3Z, S2 to 4Z, S2 to 5Z, and S2 to 6Z having the positive logic, as shown in FIG. 8. Further, as shown by the bold solid lines in the drawing, the original logical values D8 to D0 ="001011000" are restored by the decoder 38.

Moreover, when the "order of edges" of the leading edge and the trailing edge are "ADCB (No. 5)" and "DACB (No. 19)", the outputs of the comparators 32b and 30b become "111000" and "110000", respectively. In this case, as shown by the bold broken lines in the drawing, the original logical values D8 to D0 ="111010011" are restored by the decoder 38.

Figure 11:
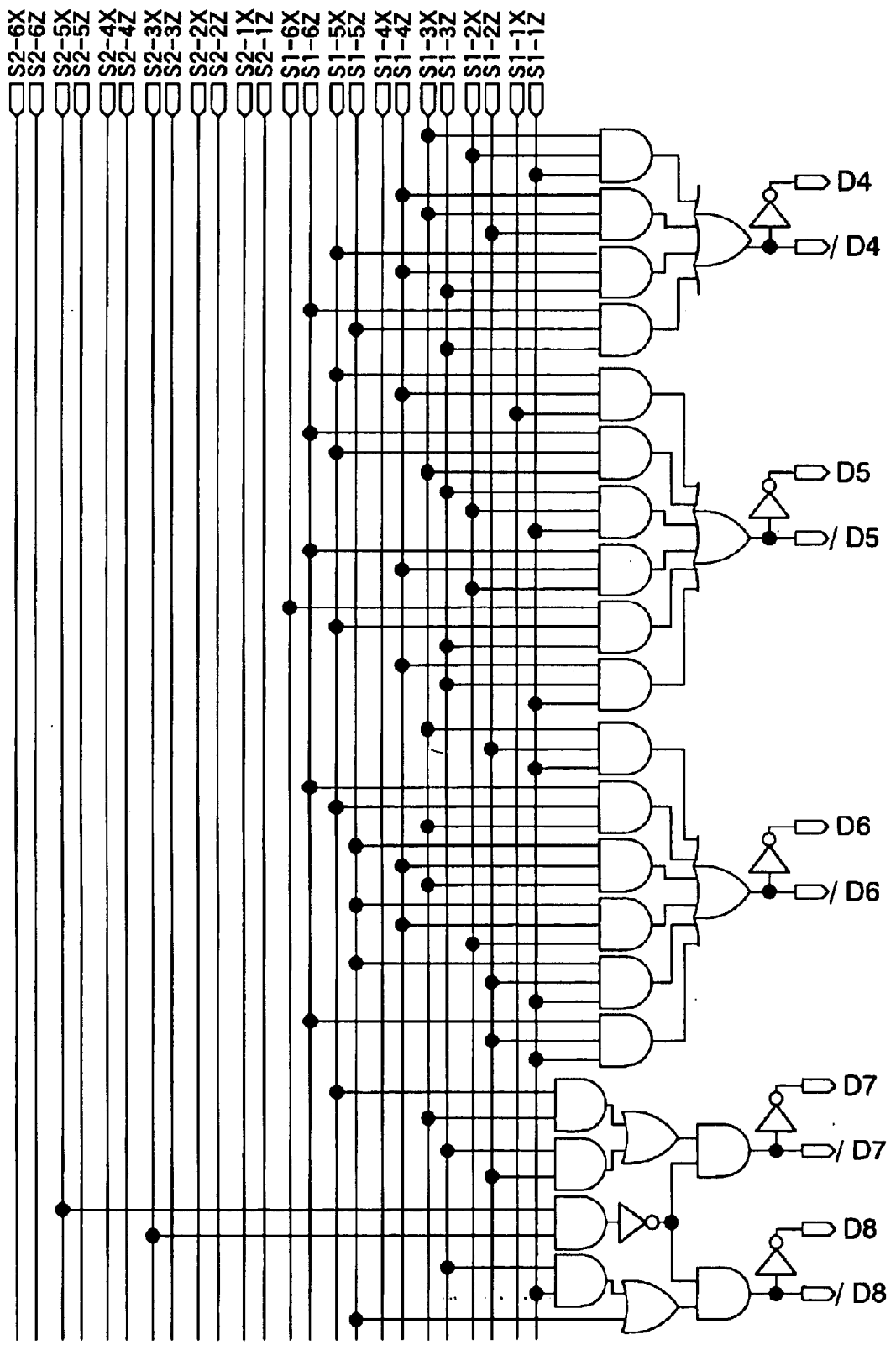
FIG. 11 is a circuit diagram showing the details of the decoder in FIG. 8.
Figure 12:
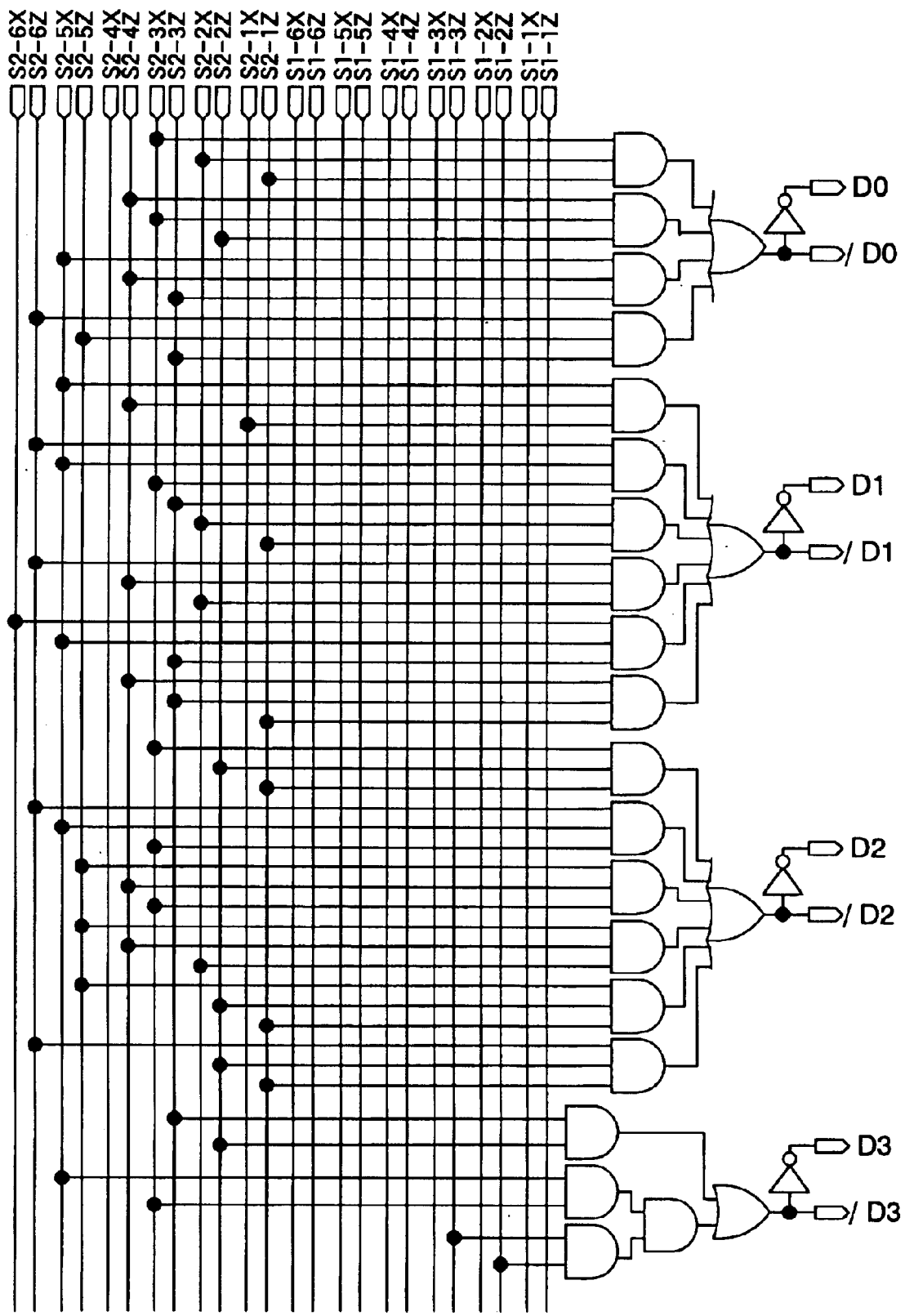
FIG. 12 is a circuit diagram showing the details of the decoder in FIG. 8.

FIG. 11 and FIG. 12 show the details of the decoder 38 in FIG. 8. FIG. 11 shows a logic circuit for restoring the logical values D4 to D8. FIG. 12 shows a logic circuit for restoring the logical values D0 to D3. The logic circuits like these are structured according to the conversion table in FIG. 10. Each logic circuit as shown in FIG. 11 and FIG. 12 is only one example for realizing the logic in the conversion table of FIG. 10 with the relatively small number of elements. There are many other circuits for realizing the same logic.

In the above-described embodiment, the logical values are expressed by the order that the transition edges appear in the plurality of the transmission signals transmitting respectively on the plurality of the data bus lines DA to DD. Hence, a large amount of data can be transmitted by the small number of the signal lines. Since a large amount of data can be transmitted by one transmission of the transmission signals, it is possible to substantially increase a data transfer rate. In concrete, the order that a leading edge appears in and the order that a trailing edge appears in said pulse signal (the plurality of the transition edges) is used to express the logical values. For this reason, 576 patterns of the logic can be expressed by the four signal lines. This exceeds nine-bit binary data (512 patterns).

Since only the small number of the data bus lines DA to DD are necessary, it is possible to reduce the number of the output circuits (output buffers) and the number of the input circuits (input buffers) of the transmission signals. The number of the circuits to be operated decreases so that power consumption can be reduced on both of the transmitting side and the receiving side of the transmission signals. Further, since only the small number of the data bus lines DA to DD are necessary, it is possible to reduce the wiring area.

The logic can be expressed by a difference in timing that the transition edges appear (relative value), and hence the standard signal is not necessary. In other words, it is not necessary to synchronize the standard signal between the transmitting side and the receiving side of the transmission signal. Thus, the structures of the transmitting circuit 14 and the receiving circuit 16 can be simplified.

Moreover, the transmitting circuit 14 and the receiving circuit 16 are formed on the separate semiconductor chips. When the semiconductor chips are mounted on a printed-wiring board, the area of the signal lines on the printed-wiring board can be reduced. As a result of this, the size of the printed-wiring board is reduced, which makes it possible to reduce the size of a system and reduce the cost of the system.

Since the logical values can be expressed by the order that the transition edges appear in the transmission signals, a large amount of data can be transmitted by structuring the simple logic circuits for both of the transmitting circuit 14 and the receiving circuit 16. In concrete, the data transmitting circuit 14 of the transmitting device 10 may generate the L-pulse in accordance with the logical values of the data to be transferred. Hence, the transmitting circuit 14 can be structured by the simple logic circuit. The receiving circuit 16 in the receiving device 12 may compare the edges of the received signals and judge which edge is earlier. Hence, the receiving circuit 16 can be structured by the simple logic circuit as well. The circuit scales of the transmitting circuit 14 and the receiving circuit 16 can be reduced, and therefore, it is possible to reduce the chip size of the semiconductor integrated circuit to which the circuits like the above are mounted.

Since the output transistor of the open drain type is formed in the edge generator 26, the plurality of the transmitting circuits 14 can be connected to the data bus lines DA to DD.

Figure 13:
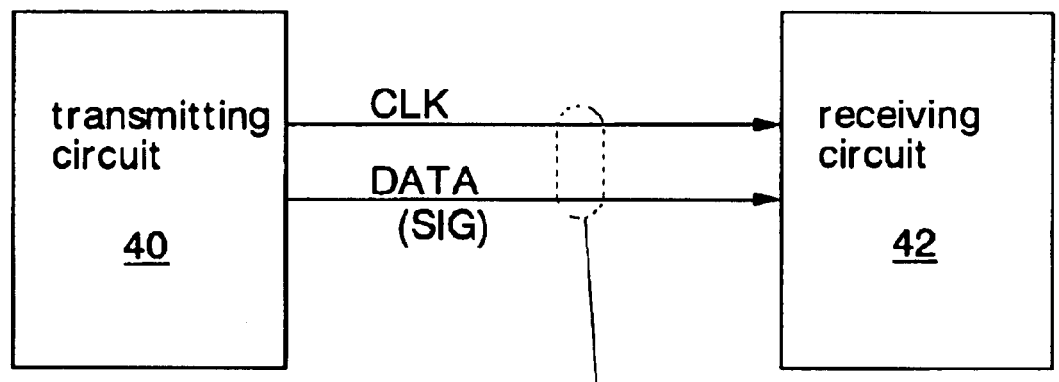
FIG. 13 is an explanatory view showing the second basic principle in the present invention.
Figure 13:
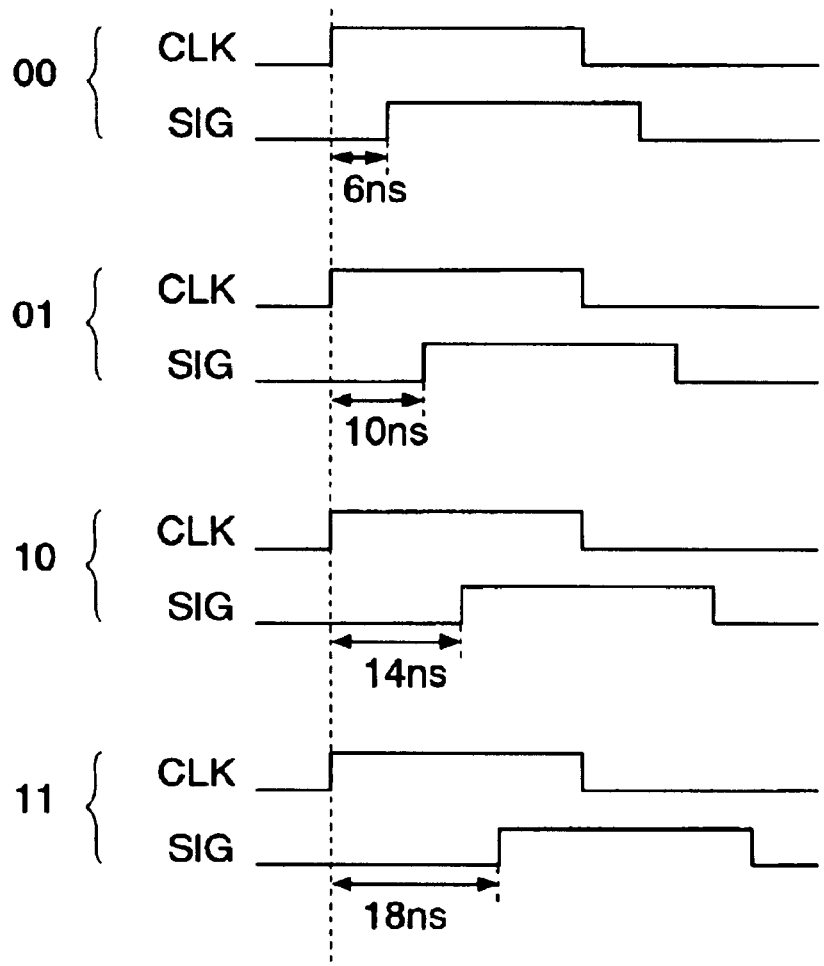

FIG. 13 shows the second basic principle in the present invention. Here, an example of transmitting data from a transmitting circuit 40 to a receiving circuit 42 by using a clock signal line (CLK) for transmitting a standard timing signal CLK (clock signal) and one data bus line (signal line) DATA will be explained.

The transmitting circuit 40 outputs a transmission signal SIG which is delayed for a predetermined time with reference to an up edge of the standard timing signal CLK. The logical values of the data are expressed by delay time (time difference) of transition edges of the transmission signal SIG to transition edges of the standard timing signal CLK. In this example, four patterns of delay times are set so that the two-bit data can be transferred by one signal line.

The differences in timings that the transition edges appear in the transmission signals SIG are respectively set as 4 ns. This difference is set according to the characteristics of the transmitting circuit 40, the receiving circuit 42, and a transmission line (the data bus line DATA in this example). The standard timing signal CLK and the transmission signals SIG are respectively generated by delaying the standard timing signal CLK itself for predetermined times according to the logical values. The transition edges of the transmission signals SIG are delayed by, for example, 6 ns, 10 ns, 14 ns, and 18 ns, respectively, with reference to the transition edges of the standard timing signal CLK.

Meanwhile, the receiving circuit 42 receives the standard timing signal CLK and the transmission signal SIG and detects the time difference (delay time) between the transition edges of the transmission signal SIG and the transition edges of the standard timing signal CLK. Then, the logical value is generated according to the difference. It should be mentioned that the receiving circuit 42 may restore the logical values (original logical values) which are used in the transmitting circuit 40, or it may generate logical values (for example, inverting data of the original logical values) which are specially used in the receiving circuit 42.

Thus, the data of a plurality of bits is transmitted/received by one data bus line DATA. Since the number of the data bus lines which are wired between the transmitting circuit 40 and the receiving circuit 42 can be reduced, it is possible to reduce the number of the input circuits and the output circuits of the data. As a result of this, the power consumption can be reduced. The number of the input circuits and the output circuits are reduced, and hence the chip size of the semiconductor integrated circuit to which these circuits are mounted can be reduced. Since the number of the data bus lines is reduced, it is possible to reduce the wiring area.

In the above-described example, the case of transferring the data of two bits is explained. However, it can be easily applied to the case of transferring the data of three bits or more, by increasing the number of the delay times to be set. When the data of three bits is transferred, it is suitable to set eight patterns of the delay times.

Figure 14:
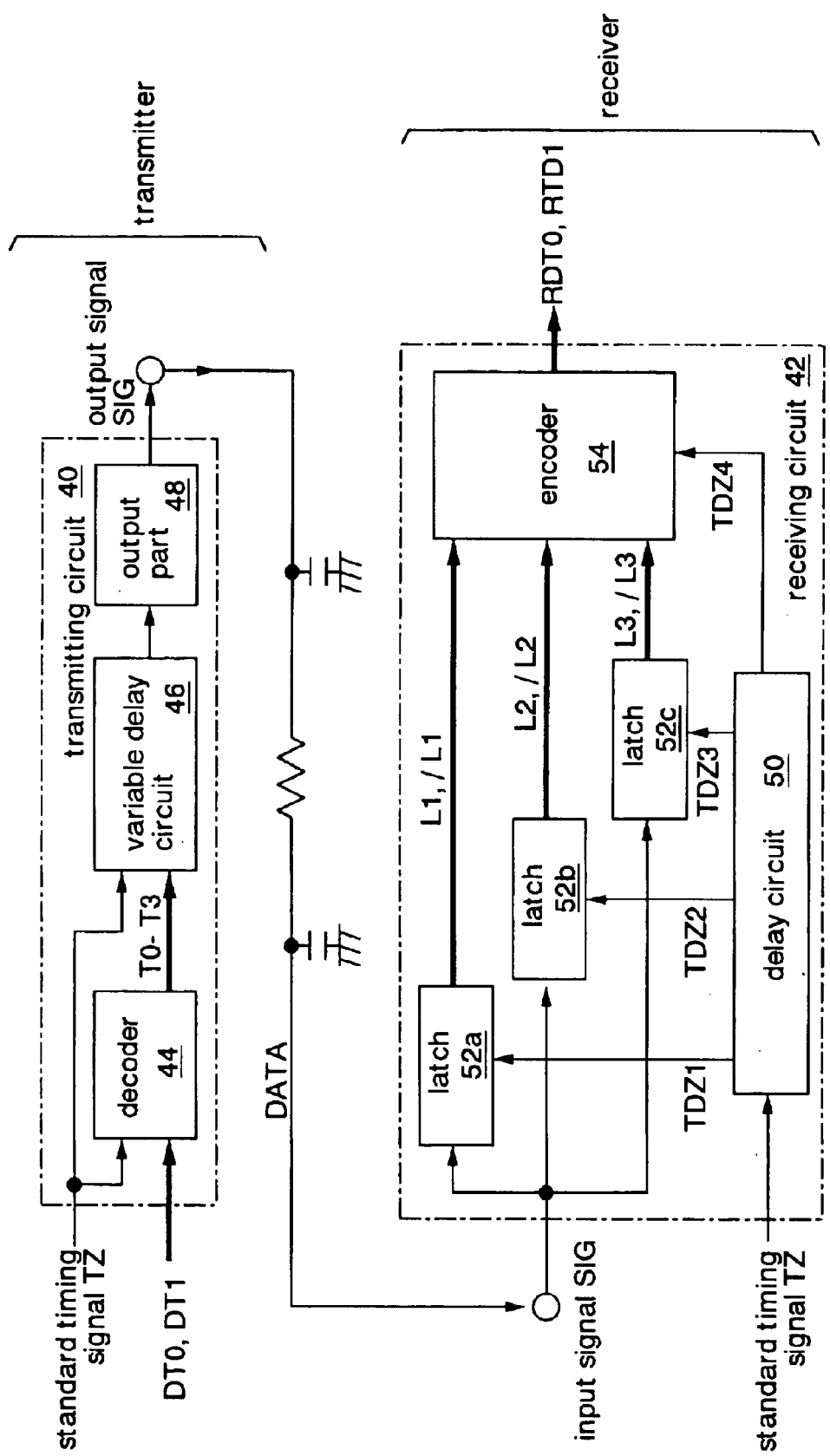
FIG. 14 is a block diagram showing the second embodiment of the present invention.

FIG. 14 shows a second embodiment of the input/output interface and the semiconductor integrated circuit according to the present invention. Signal lines shown by bold lines in the drawing mean that each of these is structured by a plurality of the lines.

The input/output interface is structured by a transmitting circuit 40, a receiving circuit 42 and a data bus line DATA as shown in FIG. 13. For example, the transmitting circuit 40 and the receiving circuit 42 are formed inside the same semiconductor memory device (semiconductor integrated circuit) of a clock synchronous type. The receiving circuit 42 is arranged near an output pad of data. The transmitting circuit 40 receives data DT0 and DT1 of a plurality of bits, which are read from a memory core (not shown), and output a transmission signal SIG corresponding to the logic of the data to the data bus line DATA. The receiving circuit 42 restores the transmission signal SIG which is received through the data bus line DATA to an original two-bit data, and outputs it to a data output circuit (peripheral circuit) or the like. The data bus line DATA is wired from the end of the memory core to near the output pad, and its wiring is long.

The transmitting circuit 40 includes a decoder 44, a variable delay circuit 46, and an output part 48. The decoder 44 decodes the data DT0 and DT1 which are read from the memory core, and outputs the result of the decoding (corresponding to the logical values) to the variable delay circuit 46. The variable delay circuit 46 delays a standard timing signal TZ for a predetermined time according to the result of the decoding, and outputs the delayed signal to the output part 48. The output part 48 outputs the received signal to the data bus line DATA as the transmission signal SIG. The standard timing signal TZ is, for example, an internal clock signal which synchronizes to a clock signal supplied from the exterior of the chip.

The receiving circuit 42 includes a delay circuit 50, latches 52a, 52b, 52c, and an encoder 54. The delay circuit 50 receives the standard timing signal TZ, and generates four timing signals TDZ1, TDZ2, TDZ3, and TDZ4 whose phases are different from that of the standard timing signal TZ. The latches 52a, 52b, and 52c latch the transmission signal SIG in synchronization with the timing signals TDZ1, TDZ2, and TDZ3, respectively. The encoder 54 generates logical values RDT0 and RDT1 consisting of two bits, in accordance with the logic levels of the transmission signal SIG which is latched by the latches 52a, 52b, and 52c. In this embodiment, the logical values RDT1 and RDT2 are the same as the logical values DT0 and DT1. Namely, the receiving circuit 42 restores the original data which is read from the memory core. Incidentally, the logical values RDT0 and RDT1 which are generated in the receiving circuit 42 may be different from the original logical values DT0 and DT1. For example, the receiving circuit 42 may generate inverting logic of the original logical values.

Thus, the latches 52a, 52b, 52c, and the encoder 54 operate as a comparing circuit which compares the phase of the transmission signal SIG transmitted from the transmitting circuit 40 and the timing signals TDZ1 to TDZ4 and detects the delay time of the transmission signal SIG with reference to the standard timing signal TZ. Incidentally, the standard timing signal TZ is received by the receiving circuit 42 behind the standard timing signal TZ which is received by the transmitting circuit 40, by the time corresponding to a load of the data bus line DATA.

Figure 15:
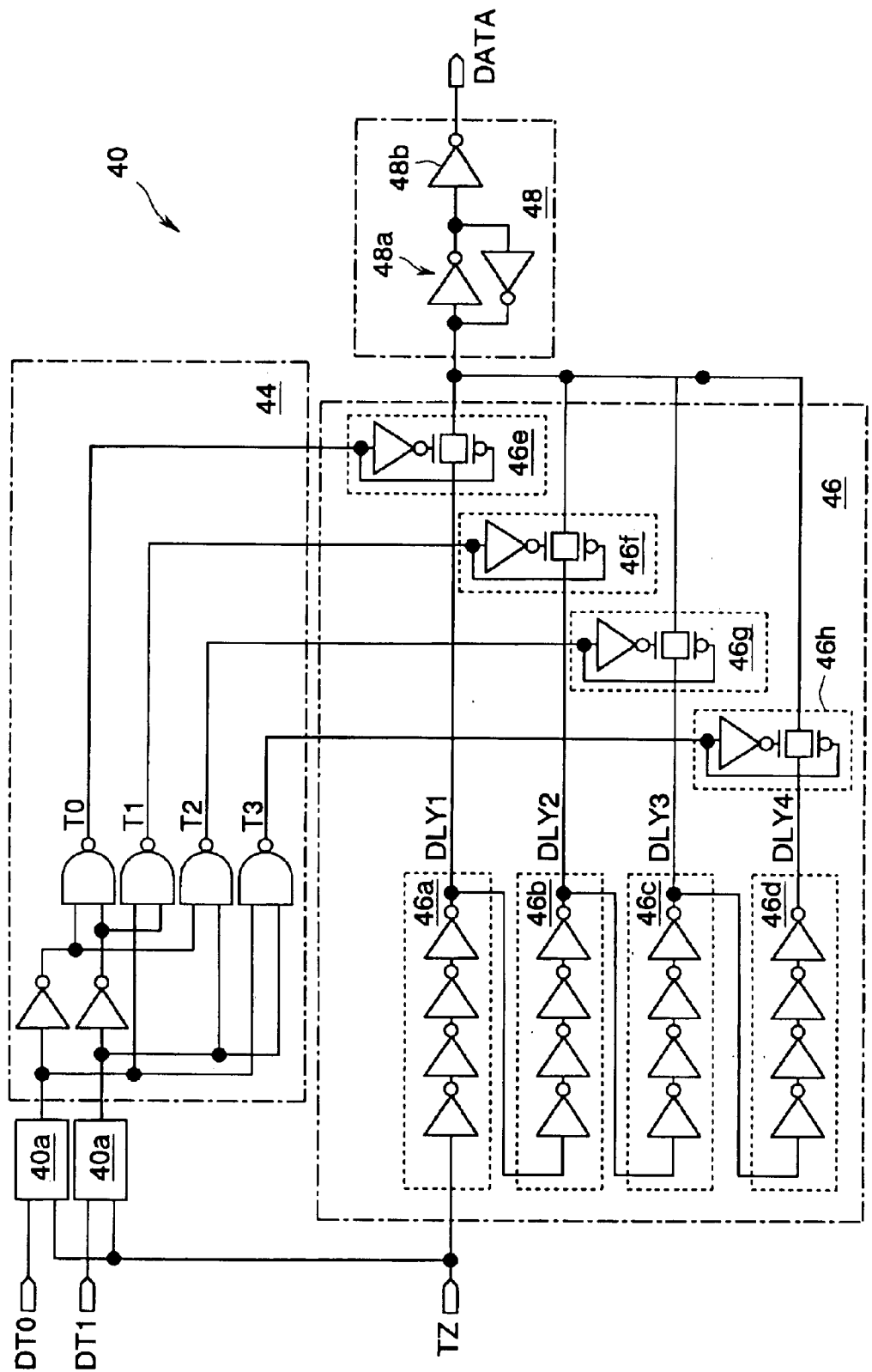
FIG. 15 is a circuit diagram showing the details of a transmitting circuit in FIG. 14.

FIG. 15 shows the details of the transmitting circuit 40 in FIG. 14. The decoder 44 receives the logical values DT0 and DT1, which are read from the memory core, through read amplifiers 40a, and decodes the received data. Namely, any of decoding signals T0, T1, T2, and T3 changes to the low level, in accordance with the logical values DT0 and DT1.

The variable delay circuit 46 includes four delay stages 46a, 46b, 46c, and 46d which are connected in cascade, and switching circuits 46e, 46f, 46g, and 46h which are respectively controlled by the decoding signals T0 to T3. The delay stages 46a to 46d respectively delay the standard timing signal TZ for predetermined times and output delay signals DLY1, DLY2, DLY3, and DLY4. The delay time of each of the delay stages 46a to 46d is set at approximately 4 ns. Therefore, the delay signals DLY1 to DLY4 are delayed by 4 ns with reference to the standard timing signal TZ in sequence and outputted.

Each of the switching circuits 46e to 46h is structured by a CMOS transmission gate and an inverter for controlling the CMOS transmission gate. In each of the switching circuits 46e to 46h, one terminal receives the delay signals DLY1 to DLY4, respectively, and the other terminal is connected to the output part 48. Further, any of the delay signals DLY1 to DLY4 is outputted to the output part 48 according to the decoding signals T0 to T3.

The output part 48 includes a latch circuit 48a for latching the delay signal outputted from the variable delay circuit 46 and an output buffer 48b. The transmission signal SIG whose timing is shown in FIG. 13 is latched in the latch circuit 48a and outputted from the output buffer 48b.

Figure 16:
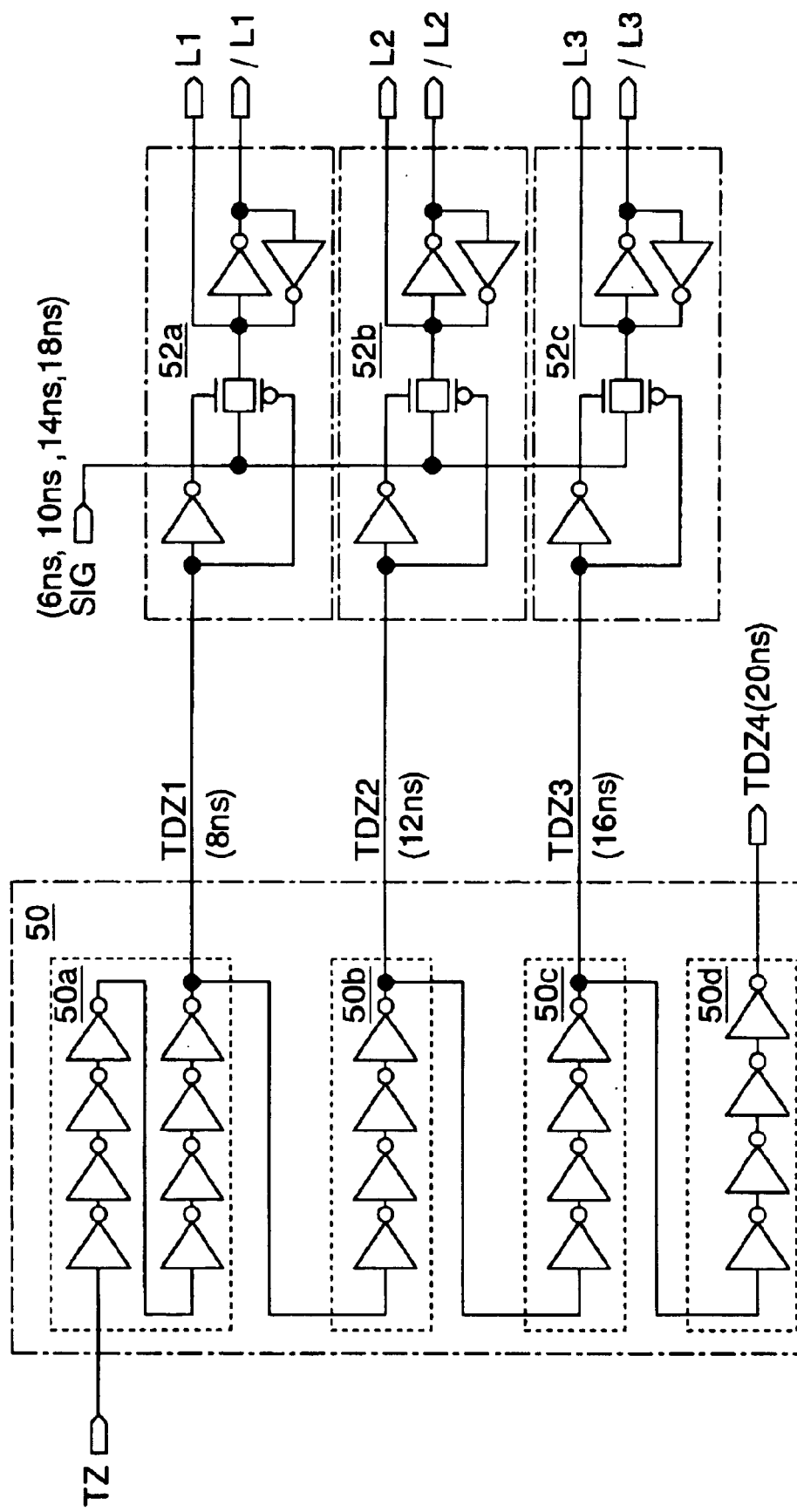
FIG. 16 is a circuit diagram showing the details of the delay circuit and latch circuit in the receiving circuit in FIG. 14.

FIG. 16 shows the details of the delay circuit 50 and the latch circuits 52a, 52b, and 52c in the receiving circuit 42 in FIG. 14. The delay circuit 50 includes four delay stages 50a, 50b, 50c, and 50d which are connected in cascade. The delay stages 50a to 50d respectively output the timing signals TDZ1, TDZ2, TDZ3, and TDZ4 which are time signals respectively delayed from the standard timing signal TZ by predetermined time periods. The delay time of the delay stage 50a is set at approximately 8 ns and the delay time of each of the delay stages 50b to 50d is set at approximately 4 ns. Therefore, the timing signals TDZ1, TDZ2, TDZ3, and TDZ4 are respectively delayed by 8 ns, 12 ns, 16 ns, and 20 ns to the standard timing signal TZ, and outputted.

Each of the latch circuits 52a, 52b, and 52c is structured by a CMOS transmission gate, an inverter for controlling the CMOS transmission gate and a latch. The latch circuit 52a latches the logic level of the transmission signal SIG in synchronization with a rising edge of the timing signal TDZ1. The latch circuit 52b latches the logic level of the transmission signal SIG in synchronization with a rising edge of the timing signal TDZ2. The latch circuit 52c latches the logic level of the transmission signal SIG in synchronization with a rising edge of the timing signal TDZ3. Hence, when a rising edge of the transmission signal SIG is earlier than the rising edge of the timing signal, the high level is latched to the latch circuit. When the rising edge of the transmission signal SIG is later than the rising edge of the timing signal, the low level is latched to the latch circuit.

As described above, the timing signals TDZ1 to TDZ3 are respectively delayed by 8 ns, 12 ns, and 16 ns to the standard timing signal TZ, and the transmission signal SIG is delayed by any of 6 ns, 10 ns, 14 ns, and 18 ns to the standard timing signal TZ. Namely, in this embodiment, a timing margin for the latch circuits 52a to 52c to operate properly is set as 2 ns. The data latched by the latch circuits 52a to 52c are respectively outputted as latch signals L1, L2, and L3 and these inverting signals /L1, /L2, and /L3.

Figure 17:
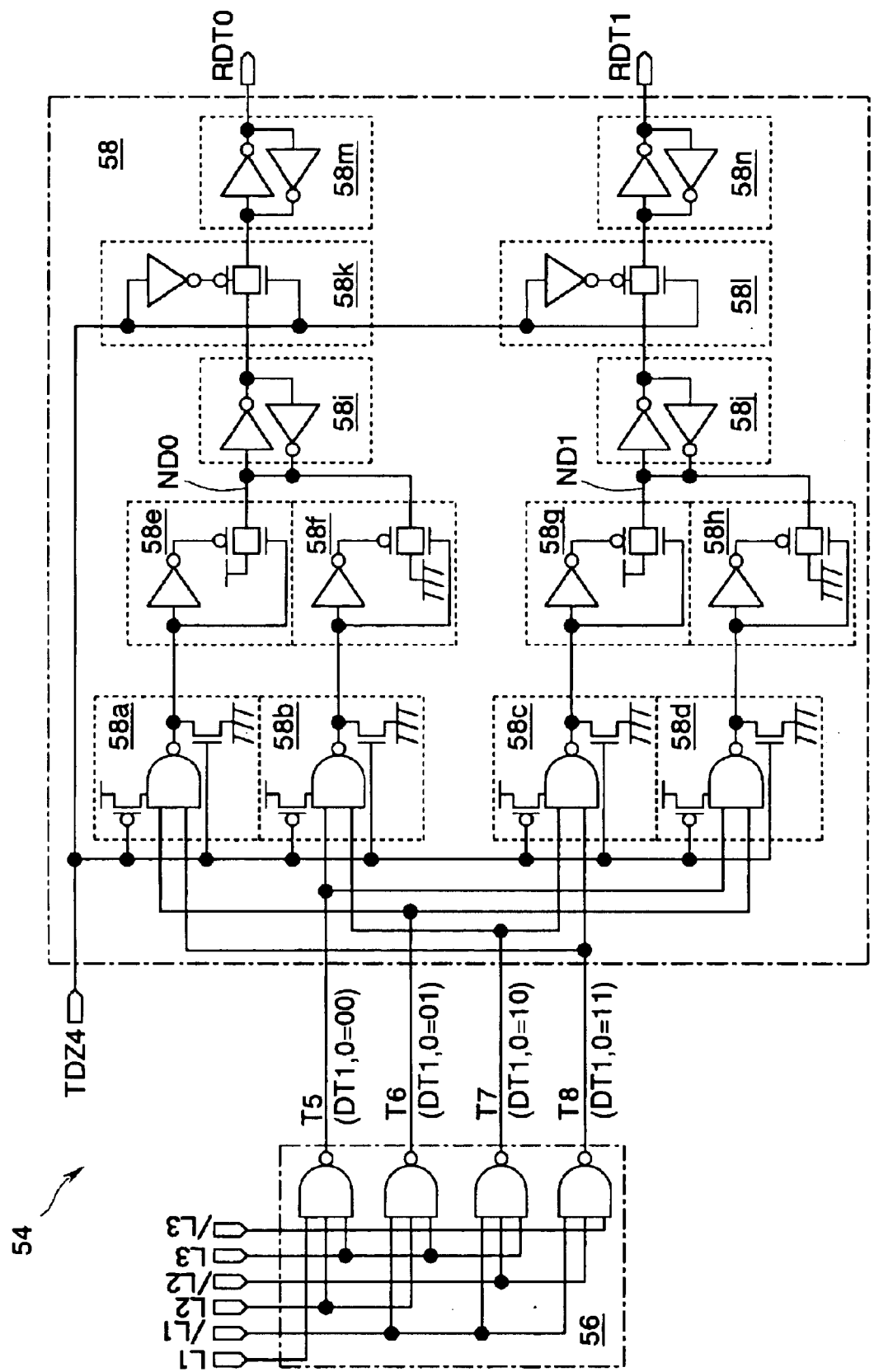
FIG. 17 is a circuit diagram showing the details of the encoder in the receiving circuit in FIG. 14.

FIG. 17 shows the details of the encoder 54 in the receiving circuit 42 in FIG. 14. The encoder 54 includes a decoder 56 for decoding the latch signals L1, L2, L3, /L1, /L2, and /L3, and a data generator 58 for generating two-bit logical values in accordance with the result of the decoding by the decoder 56.

The decoder 56 turns any of decoding signals T5, T6, T7, and T8 into the low level according to the logical values DT1 and DT0 transferred from the transmitting circuit 40 in FIG. 14. For example, as shown in parentheses in the drawing, the decoding signal T5 is turned into the low level when the logical values DT1 and DT0 are "00", and the decoding signal T6 is turned into the low level when the logical values DT1 and DT0 are "01".

The data generator 58 includes NAND circuits 58a, 58b, 58c, and 58d, CMOS transmission gates 58e, 58f, 58g, and 58h, latches 58l and 58j, switching circuits 58k and 58l, and latches 58m and 58n.

The NAND circuits 58a to 58d are operated when the timing signal TDZ4 is at the low level to make logical calculations of the decoding signals T5 to T8, and inactivated when the timing signal TDZ4 is at the high level to output the low level. Namely, data to be encoded is decided in synchronization with a rising edge of the timing signal TDZ4. The timing signal TDZ4 is the transmission signal which delays the latest timing signal TDZ3, as shown in FIG. 16. For this reason, the data generator 58 can encode the received data quickly and securely, by using the timing signal TDZ4.

The CMOS transmission gates 58e to 58h are respectively controlled by outputs of the NAND circuits 58a to 58d. A node ND0 changes to the high level by turning on the CMOS transmission gate 58e, and changes to the low level by turning on the CMOS transmission gate 58f. A node ND1 changes to the high level by turning on the CMOS transmission gate 58g and changes to the low level by turning on the CMOS transmission gate 58h.

The latches 58l and 58j respectively hold inverting values of the logic levels of the nodes ND0 and ND1. The switching circuits 58k and 58l are turned on when the timing signal TDZ4 is at the high level, and connect the latch 58i and the latch 58m, and the latch 58l and the latch 58n, respectively. The latches 58m and 58n invert the latched values, and output these as the logical values RDT0 and RDT1. The logic levels of the logical values RDT0 and RDT1 are the same as those of the nodes ND0 and ND1.

Figure 18:
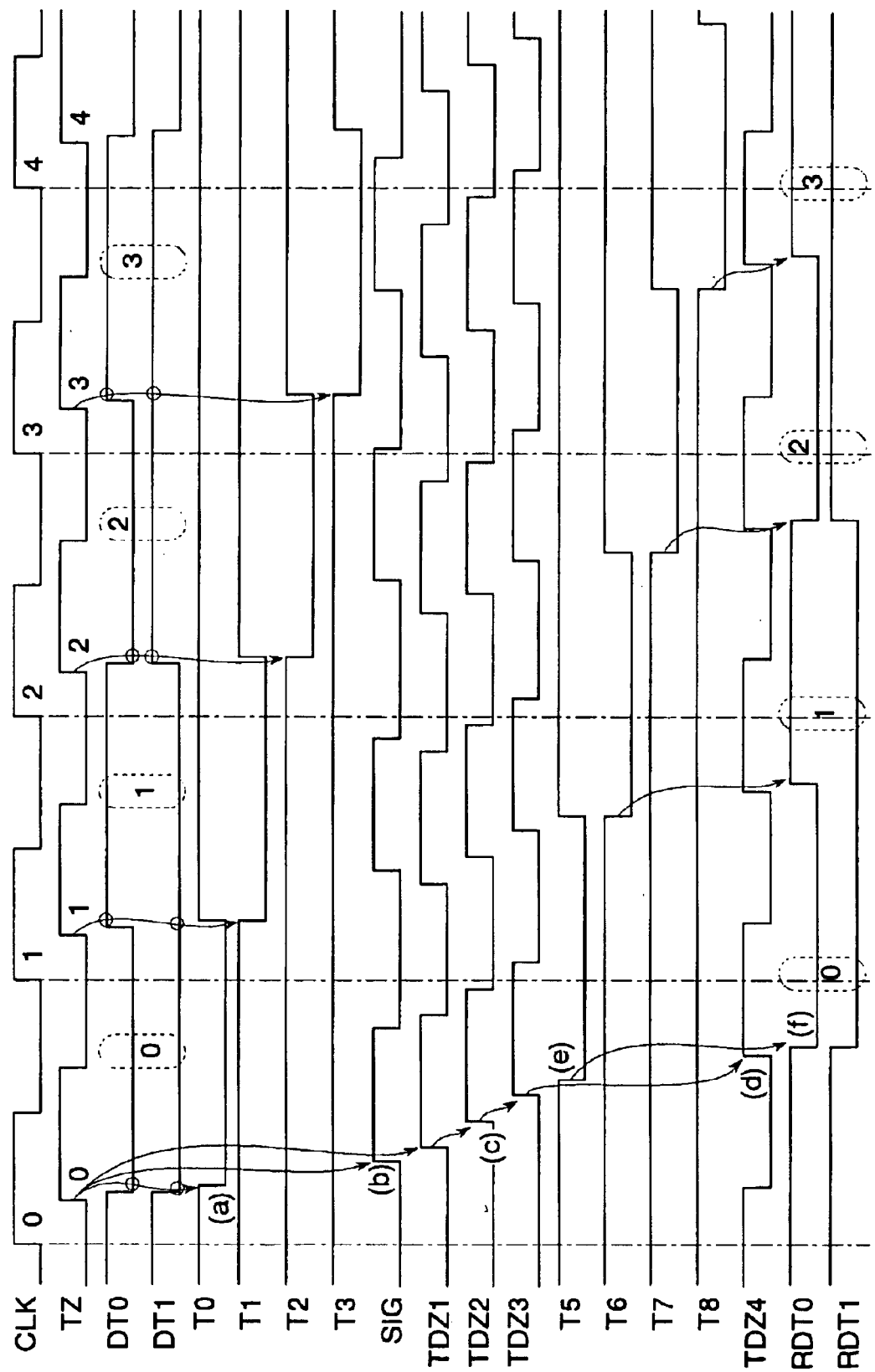
FIG. 18 is a timing chart showing the operation of the transmitting circuit and receiving circuit in the second embodiment.

FIG. 18 shows the operations of the transmitting circuit 40 and the receiving circuit 42. The transmitting circuit 40 generates the standard timing signal TZ by using an external clock signal CLK which is supplied from the exterior of the chip. In order to simplify the explanation, the timing that the standard timing signal TZ used in the receiving circuit 42 appears is made to be the same with that used in the transmitting circuit 40. Actually, the timing that the standard timing signal TZ used in the receiving circuit 42 appears is delayed corresponding to the load of the data bus line DATA.

The data which is read from the memory core is transmitted to the receiving circuit 42 in synchronization with the external clock signal CLK, and outputted to the exterior of the chip in synchronization with the next external clock signal CLK. In this example, data (logical values DT1 and DT0) "00", "01", "10", and "11" are respectively transmitted to the receiving circuit 42 in synchronization with the zeroth to the third external clock signals CLK.

First, in the transmitting circuit 40, the read amplifier 40a in FIG. 15 operates in synchronization with a rising edge of the zeroth standard timing signal TZ to amplify the levels of the data DT0 and DT1. The decoder 44 decodes the amplified data DT0 and DT1 (="00") and changes only the decoding signal T0 to the low level (FIG. 18(a)).

The variable delay circuit 46 in FIG. 15 outputs the delay signals DLY1 to DLY4 in sequence, in synchronization with the standard reference signal TZ (not shown). The switching circuit 46e of the variable delay circuit 46 is turned on according to the decoding signal T0, and transmits the delay signal DLY1 to the output part 48. Then, the transmission signal SIG which corresponds to the logical value is outputted from the transmitting circuit 40 (FIG. 18(b)).

The delay circuit 50 inside the receiving circuit 42 in FIG. 16 outputs the timing signals TDZ1 to TDZ4 in sequence, in synchronization with the standard timing signal TZ (FIGS. 18(c) and (d)). The timing of the rising edge of the transmitted signal SIG appears is earlier than the timing that the rising edges of the timing signals TDZ1 to TDZ4 appear. Hence, the latch circuits 52a, 52b, and 52c respectively take in the transmission signal SIG at the high level, and outputs the latch signals L1 to L3 at the high level and the latch signals /L1 to /L3 at the low level (not shown).

The decoder 56 inside the encoder 54 in FIG. 17 decodes the latch signals L1 to L3 and /L1 to /L3, and changes only the decoding signal T5 to the low level (FIG. 18(e)). According to the change of the decoding signal T5, the outputs of the NAND circuits 58b and 58d of the data generator 58 change to the high level, and the CMOS transmission gates 58f and 58h are turned on. As a result of this, both of the nodes ND0 and ND1 are changed to the low level, and the logical values RDT0 and RDT1 are changed to the low level (FIG. 18(f)). Namely, the data which is read from the memory core is restored in the receiving circuit 42. Thereafter, the logical values RDT0 and RDT1 are outputted to the exterior as reading data, in synchronization with the first external clock signal CLK.

Subsequently, the logical values "01", "10", and "11" are transmitted from the transmitting circuit 40 to the receiving circuit 42 in synchronization with the first to the third external clock signals CLK, similarly to the zeroth clock cycle.

In the above-described embodiment, the logical values are expressed by the time difference between the transition edge of the transmission signal SIG which is transmitted on the data bus line DATA and the transition edge of the standard timing signal TZ. For this reason, the logical values of the plurality of the bits can be transmitted by one signal line. Therefore, the number of the signal lines can be reduced as compared with the conventional art. Since only the small number of the signal lines is necessary, it is possible to reduce the number of the output circuits (output buffers) and the input circuits (input buffers) of the transmission signal. The number of the circuits to be operated decreases, and therefore, the power consumption can be reduced on both of the transmitting side and the receiving side of the transmission signal.

Since only the small number of the signal lines is necessary, it is possible to reduce the wiring area of the signal line. Especially, it is highly effective to apply the present invention to transmission signals with larger bit numbers, such as data or addresses. The logical value can be converted to the transmission signal by the simple transmitting circuit 40 and the transmission signal can be converted to the logical value by the simple receiving circuit 42.

The transmitting circuit 40 and the receiving circuit 42 are formed on the same semiconductor memory device and the number of the data bus line DATA of the data read from the memory core is reduced. Thereby, it is possible to reduce the wiring area inside the semiconductor memory device. As a result of this, the chip size of the semiconductor memory device can be reduced, and the chip cost can be reduced.

Figure 19:
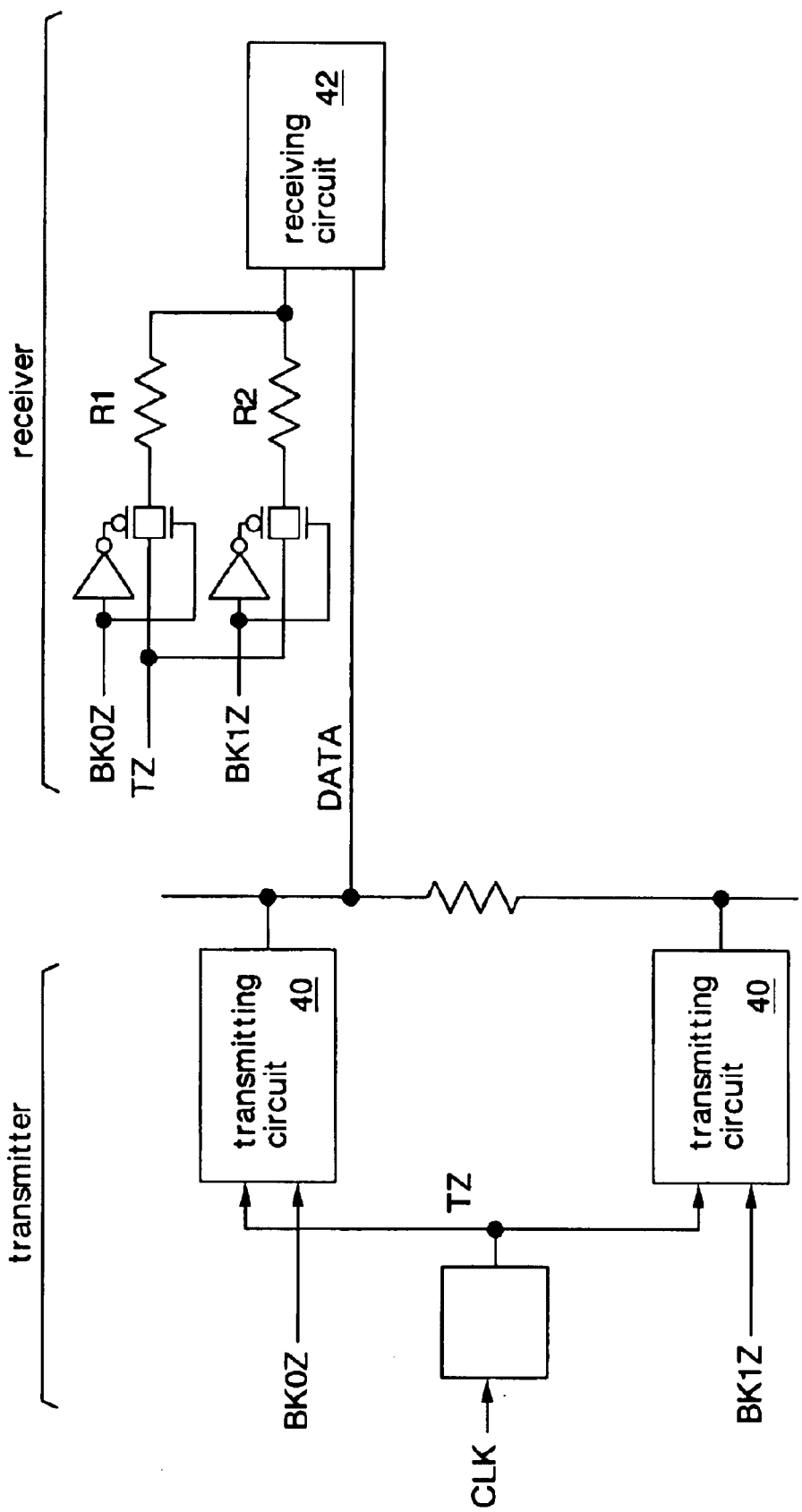
FIG. 19 is a block diagram showing the third embodiment of the present invention.

FIG. 19 shows a third embodiment of the input/output interface and the semiconductor integrated circuit of the present invention. The same numerals are given to the same elements as those in the second embodiment, and detailed explanations thereof are omitted.

In the semiconductor memory device such as DRAM, memory cells are generally formed for the most part of the chip. For this reason, it is likely that a transmitting circuit 40 for transmitting data which is read from the memory cell on one end side of the chip and a transmitting circuit 40 for transmitting data which is read from the memory cell on the other end side of the chip are arranged separately from each other. Further, when a distance between two transmitting circuits 40 and a distance between a transmitting circuit 40 and a receiving circuit 42 are different, lengths of data bus lines DATA for connecting the transmitting circuits 40 and the receiving circuit 42 are different from each other. In this case, when the timings that standard timing signals TZ inputted to the respective transmitting circuits 40 appear are the same, a delay amount (relative amount) of a transmission signal SIG, with reference to the standard timing signal TZ, changes on the receiving circuit 42 side, according to the position of the transmitting circuit 40. Therefore, it is necessary to adjust the timing that the standard timing signal TZ which is inputted to the receiving circuit 42 appears, according to the position of the transmitting circuit 40 which output the transmission signal SIG.

For example, the delay amount of the transmission signal SIG can be easily adjusted on the receiving circuit 42 side by using block selecting signals BK0Z and BK1Z for selecting the memory core and the transmitting circuits 40, and resistors R1 and R2. In an example shown in the drawing, when the transmission signal SIG is outputted from the lower transmitting circuit 40 whose wiring load is large, the standard timing signal TZ is delayed by the resistor R2 whose resistance is high. When the transmission signal SIG is outputted from the upper transmitting circuit 40 whose wiring load is small, the standard timing signal TZ is delayed by the resistor R1 whose resistance is low.

It should be noted that, when a circuit for generating the standard timing signal TZ is arranged near the lower transmitting circuit 40 in the drawing, the load of the signal line of the standard timing signal TZ between the two transmitting circuits 40 and the load of the data bus line DATA are almost equal to each other. In this case, the delay amount (relative amount) of the transmission signal SIG with reference to the standard timing signal TZ is fixed, and therefore, it is not necessary to adjust the timing that the standard timing signal TZ to be inputted to the receiving circuit 42 appears.

The same effects as those of the above-described second embodiment can be obtained in this embodiment as well. Further, it is possible to prevent a deviation in the timings to take in the receiving data due to the difference of the loads of the data bus lines DATA which are wired between the plurality of the transmitting circuits 40 and the receiving circuit 42 in the semiconductor memory device.

Figure 20:
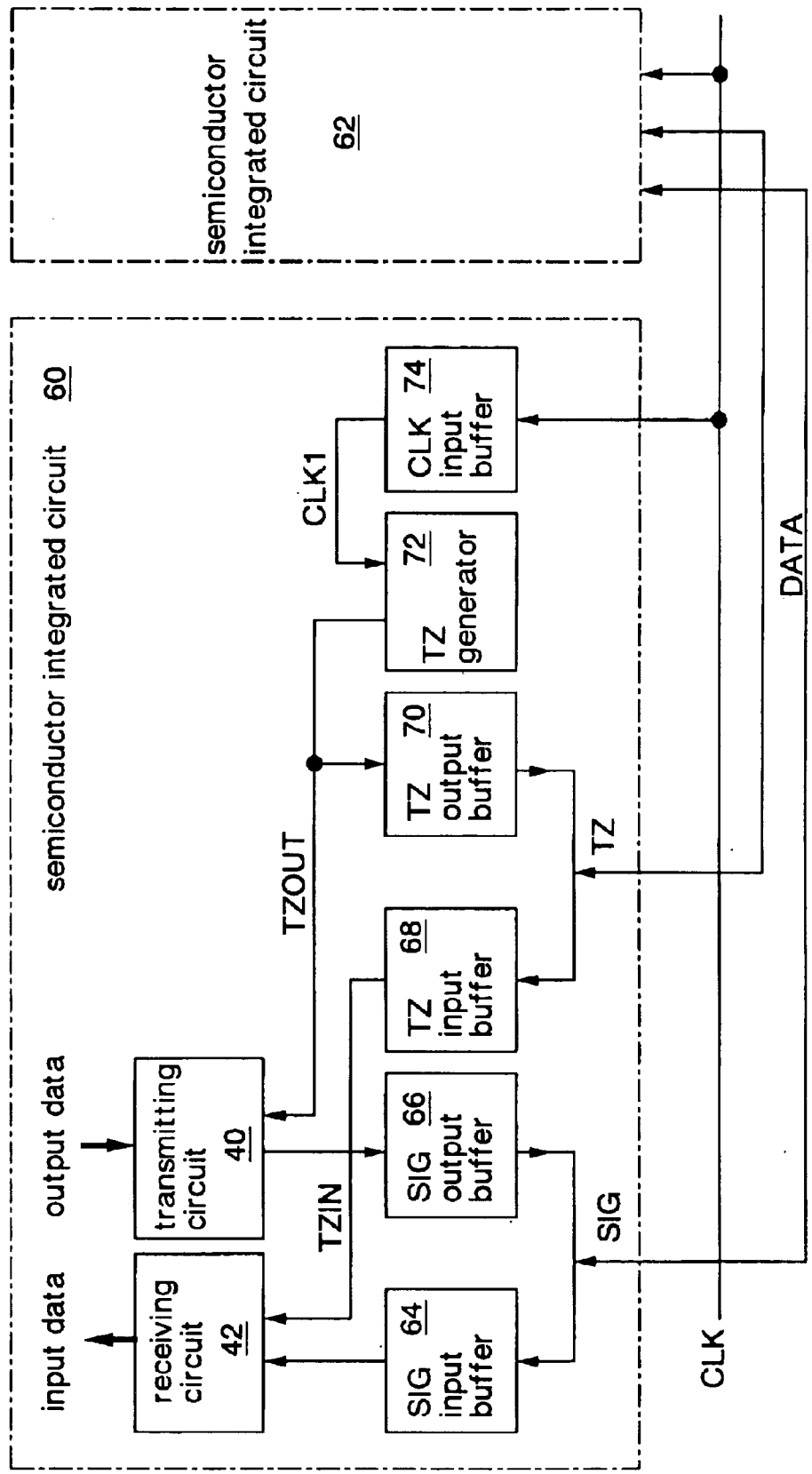
FIG. 20 is a block diagram showing the fourth embodiment of the present invention.

FIG. 20 shows a fourth embodiment of the input/output interface and the semiconductor integrated circuit of the present invention. The same numerals are given to the same elements as those in the second embodiment, and detailed explanations thereof are omitted.

In this embodiment, a transmitting circuit 40 and a receiving circuit 42 which are the same as those in the second embodiment are formed on both semiconductor integrated circuits (semiconductor chips) 60 and 62. The semiconductor integrated circuits 60 and 62 are mounted on, for example, a printed-wiring board, and connected to each other through a system bus on the printed-wiring board. Further, the semiconductor integrated circuits 60, 62 transmit/receive data to/from each other.

Since the input/output circuits of the semiconductor integrated circuits 60 and 62 are the same, only the semiconductor integrated circuit 60 will be explained in the following explanation. The semiconductor integrated circuit 60 includes an SIG input buffer 64 (first input circuit), an SIG output buffer 66 (first output circuit), a TZ input buffer 68 (second input circuit), a TZ output buffer 70 (second output circuit), a TZ generating circuit 72 (signal generating circuit) and a clock input buffer 74.

The SIG input buffer 64 outputs a transmission signal SIG which is outputted from the semiconductor integrated circuit 62 to the receiving circuit 42. The SIG output buffer 66 outputs the transmission signal SIG which is outputted from the transmitting circuit 40 to a data bus line DATA. The TZ input buffer 68 outputs a standard timing signal TZ which is outputted from the semiconductor integrated circuit 62 to the receiving circuit 42. The TZ output buffer 70 outputs a standard timing signal TZOUT which is outputted from the TZ generating circuit 72 to the transmitting circuit 40. Namely, the standard timing signal TZOUT which is generated in the TZ generating circuit 72 is not outputted directly to the system bus, but is outputted through the TZ output buffer 70. The TZ generating circuit 72 generates the standard timing signal TZOUT which synchronizes to an internal clock signal CLK1 outputted from the clock input buffer 74. The clock input buffer 74 receives an external clock signal CLK from the exterior, and outputs it as the internal clock signal CLK1.

An input of the SIG input buffer 64 and an output of the SIG output buffer 66 are connected to the data bus DATA through a common external terminal. Similarly, the TZ input buffer 68 and the TZ output buffer 70 are connected to a signal line of the standard timing signal TZ through a common external terminal. The data bus line DATA and the signal line of the standard timing signal TZ are allowed to transmit the transmission signals bidirectionally, which makes it possible to further reduce the wiring area of the signal lines.

The semiconductor integrated circuit 60 operates the SIG input buffer 64 and the TZ input buffer 68 when receiving the transmission signal SIG, and operates the SIG output buffer 66, the TZ output buffer 70, and the TZ generating circuit 72 when transmitting the transmission signal SIG. Thus, the transmitting circuit 40 and the receiving circuit 42 are formed in the semiconductor integrated circuits 60 and 62, whereby the transmission signal SIG can be transmitted bidirectionally by using the small number of the data bus lines DATA.

The same effects as those of the above-described second embodiment can be obtained in this embodiment as well. Further, it is possible to transmit/receive the data with the small number of the signal lines, because the transmitting circuit 40 and the receiving circuit 42 are respectively formed on the plurality of the semiconductor integrated circuits.

Moreover, the input of the SIG input buffer 64 and the output of the SIG output buffer 66 are connected to the common external terminal, and the signal lines are made to transmit the transmission signals bidirectionally, so that the number of the signal lines can be reduced further. Similarly, the input of the TZ input buffer 68 and the output of the TZ output buffer 70 are connected to the common external terminal, and the signal line of the standard timing signal TZ is made to transmit the transmission signal bidirectionally, so that the number of the signal lines can be reduced further.

Figure 21:
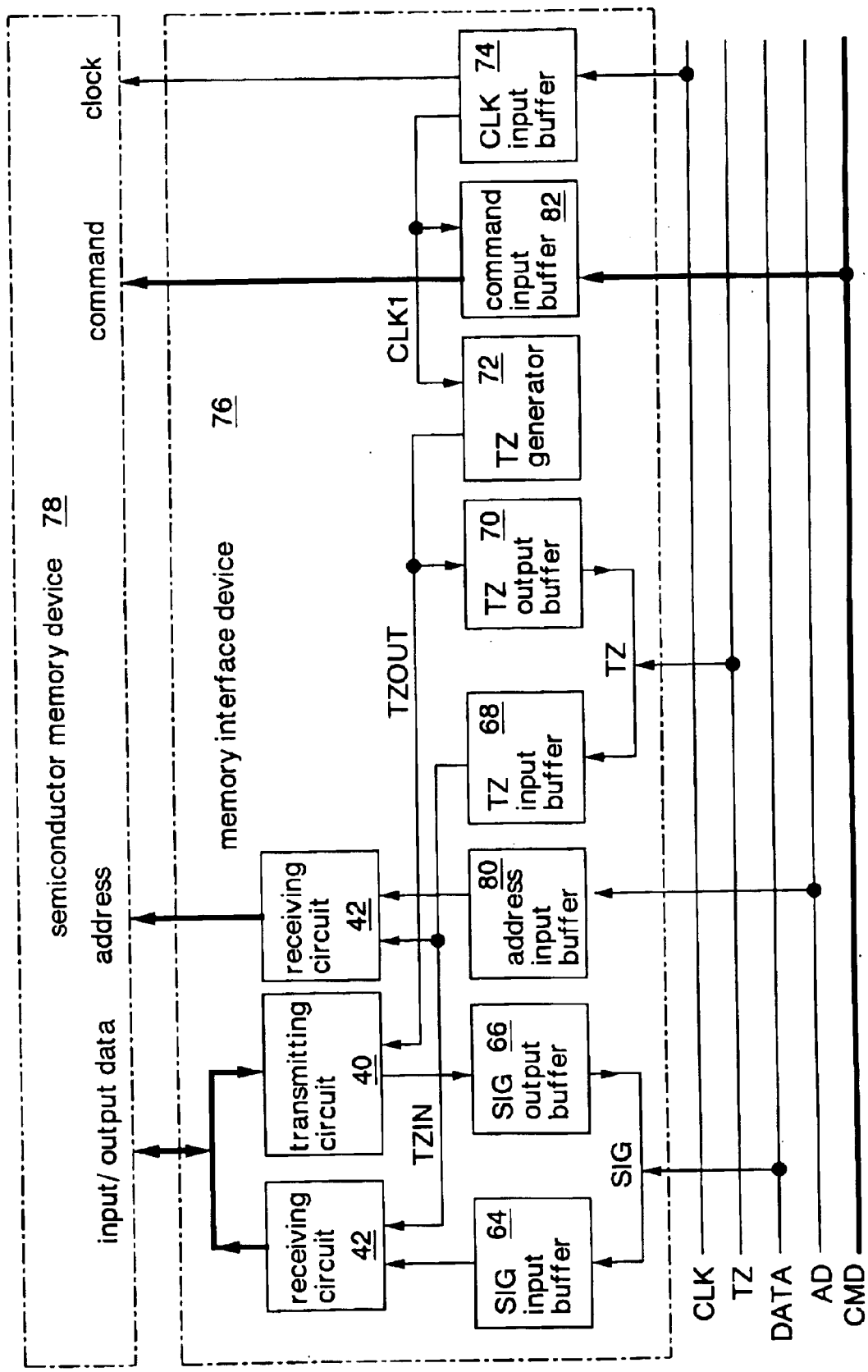
FIG. 21 is a block diagram showing the fifth embodiment of the present invention.

FIG. 21 shows a fifth embodiment of the input/output interface and the semiconductor integrated circuit of the present invention. The same numerals are given to the same elements as those in the second and the fourth embodiments, and detailed explanations thereof are omitted. This embodiment of the present invention is applied to a memory interface device 76 and a system bus. The memory interface device 76 connects the system bus and a semiconductor memory device 78. The semiconductor memory device 78 is, for example, SDRAM of a conventional type (general-purpose memory).

The memory interface device 76 includes a receiving circuit 42, a transmitting circuit 40, an SIG input buffer 64, an SIG output buffer 66, a TZ input buffer 68, a TZ output buffer 70, a TZ generating circuit 72, and a clock input buffer 74, which are the same as those in FIG. 20. Further, the memory interface device 76 includes an address input buffer 80, a command input buffer 82 and a receiving circuit 42 for receiving an address signal AD. This embodiment of the present invention is applied to a data bus and an address bus.

The address input buffer 80 receives the address signal AD from the system bus in synchronization with a standard timing signal TZ, and outputs the received address to the receiving circuit 42 for the address. The command input buffer 82 receives a command signal CMD from the system bus and outputs the received command to the semiconductor memory device 78. Data which is received in the receiving circuit 42 for the data and data (input/output data) which is read from the semiconductor memory device 78 and supplied to the transmitting circuit 40 are transmitted through the data bus line which is common to the input and the output.

In this embodiment, the data and the address, which are supplied through the system bus, are converted by the memory interface device 76 to the conventional data and the address, each of which consists of a plurality of bits, and supplied to the semiconductor memory device 78. Then, a write operation or the like is performed. Further, the data consisting of the plurality of the bits, which is read from the semiconductor memory device 78 by a read operation, is converted by the memory interface device 76 to the interface of the present invention, and outputted to the system bus.

The command signal CMD and an external clock signal CLK may be supplied directly from the system bus to the semiconductor memory device 78, without transmitting through the memory interface device 76. However, it is possible to set the optimum timing thereof with reference to the data and the address, by transmitting through the command input buffer 82 and the clock input buffer 74.

The same effects as those of the above-described second and the fourth embodiments can be obtained in this embodiment as well. Further, the present invention is applied not only to the interface of the data signal, but also to the interface of the address signal, so that the number of the signal lines of the system bus can be reduced as compared with the fourth embodiment, and the power consumption can be further reduced.

Moreover, since the present invention is applied to the memory interface device 76, the general-purpose memory which has been mass-produced can be easily connected to the system bus to which the present invention is applied.

Incidentally, in the above-described first embodiment, the example of expressing the logic of the transmission signal by the pulse signal is explained. The present invention is not limited to the above embodiment. For example, either of the rising edge or the trailing edge of the transmission signal may be used to express the logic by combining the order. Further, the logic may be expressed by combining the order of the three or more transition edges of the transmission signals.

In the above-described first embodiment, the example of forming the output transistor of the open drain type in the transmitting circuit 14 is explained. The present invention is not limited to the above embodiment. For example, a three-state output circuit may be formed according to the numbers and the specifications of the transmitting circuit and the receiving circuit to be connected to the signal line, or an output buffer which is simply made of an inverter may be formed.

In the above-described first embodiment, the example of applying the present invention to the input/output interface for transmitting the data between the different semiconductor integrated circuits is explained. The present invention is not limited to the above embodiment. For example, the present invention may be applied to an input/output interface for transmitting the data between function blocks which are mounted on the same chip. One example is that the present invention may be applied to the transmission of an address signal which is outputted from a CPU to a memory, in the system LSI in which the CPU and the memory are mounted on the same chip.

In the above-described second embodiment, the example of applying the present invention to the interface for transmitting the data which is read from the memory core to the peripheral circuit is explained. The present invention is not limited to the above embodiment. For example, the present invention may be applied to an interface for transmitting writing data from the peripheral circuit to the memory core.

In the above-described second embodiment, the example of forming the transmitting circuit 40 and the receiving circuit 42 on the same semiconductor memory device is explained. The present invention is not limited to the above embodiment. For example, the transmitting circuit 40 and the receiving circuit 42 are formed on the separate semiconductor chips, whereby the number of the signal lines to be wired between the semiconductor chips can be reduced. For example, when the semiconductor chips are mounted on the printed-wiring board, the area of the signal lines on the printed-wiring board can be reduced. As a result of this, the size of the printed-wiring board is reduced, so that the size of the system can be reduced and the cost of the system can be reduced.

The invention is not limited to the above embodiments and various modifications may be made without departing from the spirit and scope of the invention. Any improvement may be made in part or all of the components.

What is claimed is:

1. An input/output interface, wherein
   logical values are expressed respectively by orders that transition edges appear in a plurality of transmission signals transmitting respectively on a plurality of signal lines.

2. The input/output interface according to claim 1, wherein:
   each of said transmission signals includes a plurality of the transition edges; and
   said logical values are expressed by combining the orders that the respective transition edges appear in the transmission signals.

3. The input/output interface according to claim 2, wherein:
   said transmission signals are pulse signals; and
   said logical values are expressed by using the orders that the transition edges appear in the pulse signals.

4. The input/output interface according to claim 3, wherein
   said logical values are expressed by combining the orders that leading edges appear in and the orders that trailing edges appear in said pulse signals.

5. The input/output interface according to claim 4, wherein
   said plurality of the signal lines consists of three lines or more.

6. The input/output interface according to claim 1, wherein
   said transmission signals express one or both of data and an address.

7. The input/output interface according to claim 1, having a transmitting device for transmitting said transmission signals, the device comprising:
   a transmitting circuit for selecting any of a plurality of timing signals for each of said signal lines according to said logical values, the plurality of timing signals at transition edges having timings different from each other, and for generating each of said transmission signals in synchronization with each of the selected timing signals, respectively.

8. The input/output interface according to claim 7, wherein said transmitting circuit comprises:
   a delay circuit including a plurality of delay stages connected in cascade, receiving a standard signal on an initial stage of the delay stages, and outputting each of said timing signals, which each is the standard signal delayed, from each delay stage;
   a selecting circuit for selecting any one of the timing signals for each of said signal lines, according to the logical values; and
   an edge generator for generating the transition edge for each of said transmission signals, in synchronization with each of said selected timing signals.

9. The input/output interface according to claim 8, wherein:
   said transmission signals are pulse signals:
   said logical values are expressed by combining the orders that leading edges appear and the orders that trailing edges appear in each-of said pulse signals;
   said delay circuit outputs said timing signals for said leading edges and said trailing edges, respectively;
   said selecting circuit includes a first selecting circuit and a second selecting circuit for the leading edge and the trailing edge, respectively; and
   said edge generator generates the leading edges of said pulse signals in synchronization with said timing signals selected in said first selecting circuit, and the trailing edges of said pulse signals in synchronization with said timing signals selected in said second selecting circuit.

10. The input/output interface according to claim 9, wherein
    said edge generator includes an output transistor of an open drain type.

11. The input/output interface according to claim 8, wherein:
    said transmitting circuit includes a decoder for decoding said logical value values; and
    said selecting circuit selects the respective timing signals according to the result of the decoding by the decoder.

12. The input/output interface according to claim 1 having a receiving device for receiving said transmission signals, the device comprising:
    a receiving circuit including a comparing circuit for comparing the orders that the transition edges appear in said transmission signals, and a logical value generating circuit for generating the logical value values according to the result of the comparison by the comparing circuit.

13. The input/output interface according to claim 12, wherein
    each of the logical values generated by said receiving circuit is an original logical value used in a transmitting device for transmitting said transmission signals.

14. The input/output interface according to claim 12, wherein:
    each of said transmission signals includes a plurality of the transition edges; and
    said comparing circuit includes a plurality of comparators for comparing the orders that the respective transition edges appear in said transmission signals.

15. The input/output interface according to claim 14, wherein:
said transmission signals are pulse signals; and
said plurality of the comparators are a plurality of first comparators for comparing leading edges of said transmission signals and a plurality of second comparators for comparing trailing edges thereof.

16. The input/output interface according to claim 12, wherein:
said comparing circuit includes a plurality of flip-flops, each of which receives two different transmission signals of said transmission signals; and
said orders that the transition edges appear are decided according to output levels of the plurality of the flip-flops.

17. The input/output interface according to claim 12, wherein
said logical value generating circuit includes a decoder for decoding the result of the comparison and for generating said logical values based on the result of the decoding.

18. The input/output interface according to claim 1, wherein
a transmitting circuit for transmitting said transmission signals and a receiving circuit for receiving said transmission signals are respectively formed on separate semiconductor chips.

19. The input/output interface according to claim 1, wherein
a transmitting circuit for transmitting said transmission signals and a receiving circuit for receiving said transmission signals are formed on the same semiconductor chip.

20. A semiconductor integrated circuit comprising a transmitting circuit, including:
a timing signal generator for generating a plurality of timing signals whose transition edges appear at different timings from each other;
a selecting circuit for selecting any of said timing signals for each plurality of signal lines, according to a logical value; and
an edge generator for generating transmission signals in synchronization with the selected timing signals, respectively, and for outputting the generated transmission signals.

21. A semiconductor integrated circuit comprising a receiving circuit, including:
a comparing circuit for comparing an order that transition edges appear in a plurality of transmission signals transmitting respectively through a plurality of signal lines; and
a logical value generating circuit for generating a logical value according to a result of the comparison by said comparing circuit.

22. An input/output interface, wherein
a logical value is expressed by a time difference between a transition edge of a transmission signal transmitting on a signal line and a transition edge of a standard timing signal.

23. The input/output interface according to claim 22, further comprising:
a transmitting circuit for converting the logical value, expressed with a plurality of bits, to a predetermined delay time, and for outputting said transmission signal, which is behind said standard timing signal by said delay time, to said signal line; and
a receiving circuit for detecting the delay time of the transition edge of said transmission signal transmitting through said signal line, to the transition edge of said standard timing signal, and for generating a logical value according to the detected delay time.

24. The input/output interface according to claim 23, wherein
said transmitting circuit includes a variable delay circuit for delaying said standard timing signal according to said logical value to generate said transmission signal.

25. The input/output interface according to claim 23, wherein said receiving circuit comprises:
a delay circuit for generating a plurality of timing signals whose phases are different from that of said standard timing signal; and
a comparing circuit for comparing the phase of said transmission signal and the phases of said timing signals, respectively, and for detecting the delay time of said transmission signal with reference to said standard timing signal.

26. The input/output interface according to claim 25, wherein said comparing circuit comprises:
a plurality of latch circuits for latching logic levels of said transmission signal by said timing signals, respectively; and
an encoder for generating said logical value in accordance with the respective logic levels being latched in the latch circuits.

27. The input/output interface according to claim 23, wherein
said transmission signal expresses one or both of data and an address.

28. The input/output interface according to claim 23, wherein
said logical value generated by said receiving circuit is an original logical value used in the transmitting device for transmitting said transmission signal.

29. The input/output interface according to claim 23, wherein
said transmitting circuit and said receiving circuit are respectively formed on separate semiconductor chips.

30. The input/output interface according to claim 23, wherein
said transmitting circuit and said receiving circuit are respectively formed on the same semiconductor chip.

31. The input/output interface according to claim 23, wherein:
said transmitting circuit and said receiving circuit are respectively formed on a plurality of semiconductor chips; and
each of said semiconductor chips include a first input circuit and a second input circuit for respectively receiving a transmission signal and a standard timing signal which is outputted from another semiconductor chip, a signal generating circuit for generating another standard timing signal according to an external clock signal, and a first output circuit for outputting another transmission signal.

32. The input/output interface according to claim 31, wherein
each of said semiconductor chips include a second output circuit for outputting said standard timing signal to the exterior of the respective chips.

33. The input/output interface according to claim 32, wherein an input of said second input circuit and an output of said second output circuit are connected to a common external terminal.

34. The input/output interface according to claim 31, wherein an input of said first input circuit and an output of said first output circuit are connected to a common external terminal.

35. A semiconductor integrated circuit comprising:

a transmitting circuit for converting a logical value to a predetermined delay time in accordance with the logical value, the logical value being expressed with a plurality of bits, and for outputting a transmission signal, which is behind a standard timing signal by the delay time, to a signal line.

36. A semiconductor integrated circuit comprising a receiving circuit for receiving a transmission signal, which is behind a standard timing signal by a predetermined delay time in accordance to a logical value, for detecting a delay time between a transition edge of the transmission signal transmitting through a signal line, and the transition edge of the standard timing signal, and for generating the logical value according to the detected delay time.

* * * * *